(12) United States Patent
Huang et al.

(10) Patent No.: US 11,778,839 B2
(45) Date of Patent: Oct. 3, 2023

(54) PEROVSKITE FILM, PRECURSOR COMPOSITION THEREOF, METHOD FOR PREPARING THE SAME, AND SEMICONDUCTOR ELEMENT INCLUDING THE SAME

(71) Applicant: INDUSTRIAL TECHNOLOGY RESEARCH INSTITUTE, Hsinchu (TW)

(72) Inventors: Kuo-Wei Huang, Hsinchu (TW); Yung-Liang Tung, Hsinchu (TW); Jung-Pin Chiou, Hsinchu (TW); Pei-Ting Chiu, Hsinchu (TW); Shih-Hsiung Wu, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 188 days.

(21) Appl. No.: 17/121,887

(22) Filed: Dec. 15, 2020

(65) Prior Publication Data

US 2022/0123242 A1    Apr. 21, 2022

(30) Foreign Application Priority Data

Oct. 20, 2020  (TW) ................. 109136344

(51) Int. Cl.
*H10K 30/10*     (2023.01)
*C01B 13/18*     (2006.01)
*H10K 85/00*     (2023.01)

(52) U.S. Cl.
CPC ............. *H10K 30/10* (2023.02); *C01B 13/18* (2013.01); *H10K 85/00* (2023.02)

(58) Field of Classification Search
None
See application file for complete search history.

(56) References Cited

U.S. PATENT DOCUMENTS

| | | |
|---|---|---|
| 10,079,320 B2 | 9/2018 | Snaith et al. |
| 10,535,828 B2 | 1/2020 | Saliba et al. |

(Continued)

FOREIGN PATENT DOCUMENTS

| | | |
|---|---|---|
| CN | 1816903 | 10/2011 |
| CN | 108409980 | 8/2018 |
| CN | 108495951 | 9/2018 |
| CN | 108807144 | 11/2018 |
| CN | 109742246 | 5/2019 |

(Continued)

OTHER PUBLICATIONS

English machine translation of Hayakawa (JP-2020167325-A) provided by the EPO website, All Pages, 2022. (Year: 2022).*

(Continued)

*Primary Examiner* — Daniel P Malley, Jr.
(74) *Attorney, Agent, or Firm* — AMIN, TUROCY & WATSON, LLP

(57) ABSTRACT

Provided is a perovskite film including crystal grains with a crystalline structure of $[A][B][X]_3 \cdot n[C]$, wherein [A], [B], [X], [C] and n are as defined in the specification.

The present disclosure further provides a precursor composition of perovskite film, method for producing of perovskite film, and semiconductor element including such films, as described above. With the optimal lattice arrangement, the perovskite film shows the effects of small surface roughness, and the semiconductor element thereof can thus achieve high efficiency and stability even with large area of film formation, thereby indeed having prospect of the application.

3 Claims, 24 Drawing Sheets

(56) References Cited

U.S. PATENT DOCUMENTS

| | | | |
|---|---|---|---|
| 2015/0136232 A1 | 5/2015 | Snaith et al. | |
| 2020/0028022 A1 | 1/2020 | Huang et al. | |
| 2020/0090876 A1* | 3/2020 | Zhu | H01L 51/0007 |
| 2022/0029098 A1* | 1/2022 | Su | H01L 51/0007 |
| 2022/0173365 A1* | 6/2022 | Asuo | H01L 51/5203 |

FOREIGN PATENT DOCUMENTS

| | | | |
|---|---|---|---|
| CN | 109912458 | | 6/2019 |
| CN | 109912458 A | * | 6/2019 |
| CN | 111697149 | | 9/2020 |
| JP | 2020167325 A | * | 10/2020 |
| KR | 2020-0063015 A | * | 6/2020 |
| TW | 201911616 | | 3/2019 |

OTHER PUBLICATIONS

English machine translation of Gao (CN-109912458-A) provided by the EPO website, All Pages, 2022. (Year: 2022).*

English machine translation of Im (KR-2020-0063015-A) provided by the EPO website, All Pages, 2022. (Year: 2022).*

English machine translation of Hayakawa (JP-2020167325-A) provided by the EPO website, All Pages, 2023. (Year: 2023).*

English machine translation of (JP-2020167325-A) provided by the EPO website, All Pages. 2023. (Year: 2023).*

Taiwanese Office Action for Taiwanese Patent Application No. 109136344 dated Jul. 20, 2021.

Li, et al. "Engineering Halide Perovskite Crystals through Precursor Chemistry", Small; Oct. 25, 2019; 1903613.

Deng, et al. "Surfactant-controlled ink drying enables high-speed deposition of perovskite films for efficient photovoltaic modules", Nature Energy; May 14, 2018; 560-566.

Nia, et al. "Solution-based heteroepitaxial growth of stable mixed cation/anion hybrid perovskite thin film under ambient condition via a scalable crystal engineering approach", Nano Energy; Jan. 3, 2020; 104441.

Yang, et al. "High-Performance Fully Printable Perovskite Solar Cells via Blade-Coating Technique under the Ambient Condition", Advanced Energy Materials; Mar. 30, 2015; 1500328.

* cited by examiner

PEROVSKITE FILM, PRECURSOR COMPOSITION THEREOF, METHOD FOR PREPARING THE SAME, AND SEMICONDUCTOR ELEMENT INCLUDING THE SAME

CROSS-REFERENCE TO RELATED APPLICATION

The present application is based on, and claims priority from, Taiwan Application Serial Number 109136344, filed on Oct. 20, 2020, the disclosure of which is hereby incorporated by reference herein in its entirety.

TECHNICAL FIELD

The present disclosure relates to a thin film with a perovskite structure and method for preparing the same, a precursor composition thereof, and a semiconductor element applying the same.

BACKGROUND

With the vigorous development of material science and processing technology, materials with perovskite structures exhibit high light absorption capacity, adjustable band gap, high defect tolerance, good carrier mobility, and solution processability. Recently, light-emitting diodes, lasers and light-emitting transistors have attracted much attention in the field of semiconductor element applications.

The current technology for preparing a perovskite thin film is prepared by chemical solution deposition. However, the formulation using the prior art has the problem of high surface roughness when forming large-area films, and it is difficult to precisely control the film uniformity and quality of film forming, which in turn affect the performance of the element prepared.

In view of the foregoing, it is necessary to propose a highly stable precursor composition, whereby a perovskite film with high uniformity and low impurity generation is deposited, and thereby maintaining the quality of the film formation and the performance of elements.

SUMMARY

The present disclosure provides a method for preparing a perovskite film, including dispersing or dissolving a perovskite precursor salt and a crown ether compound in a mixed solvent containing a dispersant and a polar solvent to prepare a precursor composition, wherein the dispersant is at least one selected from the group consisting of $C_{1-5}$ alkyl alcohol, $C_{2-6}$ alkoxy alcohol, and $C_{5-8}$ alkoxyalkyl ester; and the polar solvent is at least one selected from the group consisting of γ-butyrolactone, dimethyl sulfoxide, dimethylformamide, dimethylacetamide, 1,3-dimethyl propylene urea and N-methylpyrrolidone; and coating the precursor composition on a heated substrate to form the perovskite film.

The present disclosure further provides a precursor composition for preparing a perovskite film, including a mixed solvent including a dispersant and a polar solvent, wherein the dispersant is at least one selected from the group consisting of $C_{1-5}$ alkyl alcohol, $C_{2-6}$ alkoxy alcohol, and $C_{5-8}$ alkoxyalkyl ester, and the polar solvent is at least one selected from the group consisting of γ-butyrolactone, dimethyl sulfoxide, dimethylformamide, dimethylacetamide, 1,3-dimethyl propylene urea, and N-methylpyrrolidone; and a perovskite precursor salt and a crown ether compound being dispersed or dissolved in the mixed solvent.

The present disclosure further provides a perovskite film, including crystal grains each with a crystalline structure represented by the following formula:

$$[A][B][X]_3 \cdot n[C]$$

wherein [A] includes monovalent cations of $M_1$, $M_2$ and $M_3$; $M_1$ is a substituted or unsubstituted ammonium ion, $M_2$ is a substituted or unsubstituted amidine ion, $M_3$ is at least one alkali-metal ion selected from the group consisting of $Cs^+$, $Rb^+$, $Li^+$ and $Na^+$, and the substituents of the above $M_1$ and $M_2$ are each $C_{1-20}$ alkyl or $C_{6-20}$ aryl when being substituted;

[B] is at least one divalent cation selected from the group consisting of $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, and $Eu^{2+}$;

[X] is at least two monovalent anions selected from the group consisting of $F^-$, $Cl^-$, $Br^-$, $I^-$, $SCN^-$, $OCN^-$;

[C] is a crown ether compound; and n is a value of 0.01 to 10.

The present disclosure further provides a semiconductor element including the perovskite film of the above.

BRIEF DESCRIPTION OF DRAWINGS

The implementation modes of the present disclosure will be described through exemplary drawings:

FIG. 5G is an enlarged view of FIG. 5F;

DETAILED DESCRIPTION

The implementation modes of the present disclosure will be illustrated by following embodiments, anyone skilled in the art can easily realize the advantages and effects of the present disclosure based on the disclosure of the present specification. The present disclosure can also be performed or applied by other different implementation modes, and each of the details in the present specification can be differently modified and altered based on different views and applications, without departing from the spirit of the present disclosure. Furthermore, all of the ranges and values herein are inclusive and combinable. Any value or point fallen within the range of the present disclosure, such as any integers, can be used as the lower or upper limit to derive a subrange.

Figure 1:
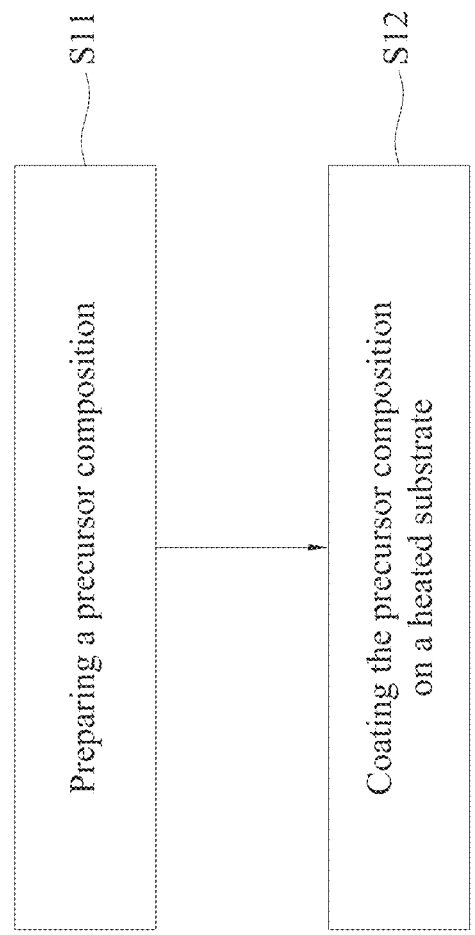
FIG. 1 is a flow chart of the preparation method of the perovskite film of the present disclosure.

Refer to FIG. 1, which illustrates the flow of the preparation method of the perovskite film disclosed in the present disclosure. First, preparing a precursor composition (step S11); and coating the precursor composition on a heated substrate (step S12) to form a perovskite film are illustrated.

The present disclosure further provides a precursor composition for preparing a perovskite film, including: a mixed solvent containing a dispersant and a polar solvent, wherein the dispersant is at least one selected from the group consisting of $C_{1-5}$ alkyl alcohol, $C_{2-6}$ alkoxy alcohol and $C_{5-8}$ alkoxyalkyl ester, the polar solvent is at least one selected from the group consisting of γ-butyrolactone, dimethyl sulfoxide, dimethylformamide, dimethylacetamide, 1,3-dimethyl propylene urea, and N-methylpyrrolidone; and a perovskite precursor salt and a crown ether compound being dispersed or dissolved in the mixed solvent.

In one embodiment, the volume ratio of the polar solvent to the dispersant is 4:1 to 20:1.

In one embodiment, the volume percentage of the polar solvent in the precursor composition is 70 to 95%. In other embodiments, the volume percentage of the polar solvent may be 72.5, 75, 77.5, 80, 82.5, 85, 87.5, 90, or 92.5% in the precursor composition.

In one embodiment, the volume percentage of the dispersant in the precursor composition is 5 to 10%. In other embodiments, the volume percentage of the dispersant may be 5.5, 6, 7, 7.5, 8, 8.5, 9 or 9.5% in the precursor composition, but not limited thereto.

In one embodiment, the crown ether compound may be at least one selected from the group consisting of 12-crown-4, 15-crown-5, 18-crown-6, 21-crown-7, 24-crown-8, and 30-crown-10.

In one embodiment, the molarity of the crown ether compound in the precursor composition is 0.2 mM to 1.6 mM. In other embodiments, the molarity of the crown ether compound may be 0.25, 0.3, 0.35, 0.4, 0.45, 0.5, 0.55, 0.6, 0.65, 0.7, 0.75, 0.8, 0.85, 0.9, 0.95, 1, 1.1, 1.2, 1.3, 1.4 or 1.5 mM in the precursor composition, but not limited thereto.

In one embodiment, the molarity of the perovskite precursor salt in the precursor composition is 0.01 M to 2 M. In other embodiments, the molarity of the perovskite precursor salt may be 0.02, 0.03, 0.04, 0.05, 0.1, 0.2, 0.3, 0.4, 0.5, 0.6, 0.7, 0.8, 0.9, 1, 1.1, 1.2, 1.3, 1.4, 1.5, 1.6, 1.7, 1.8 or 1.9 M in the precursor composition, but not limited thereto.

In another embodiment, the polar solvent is γ-butyrolactone (GBL) and dimethyl sulfoxide (DMSO), wherein the volume ratio of γ-butyrolactone and dimethyl sulfoxide is 10:1 to 1:10.

Compared with the commonly used solvent dimethylformamide (DMF), the precursor composition of the present disclosure is not carcinogenic due to the use of γ-butyrolactone (GBL) and dimethyl sulfoxide (DMSO), so it does not cause serious health hazards to field workers.

In one embodiment, the present disclosure provides a method for preparing a precursor composition for producing a perovskite film, including the following steps of: dispersing or dissolving the perovskite precursor salt in a mixed solvent containing γ-butyrolactone and dimethyl sulfoxide to form a first solution; dissolving the crown ether compound in γ-butyrolactone to form a second solution; and adding the dispersant after mixing the first solution and the second solution to obtain the precursor composition.

The perovskite precursor salt herein includes a compound having the chemical formula [A][X] and a compound having the chemical formula $[B][X]_2$:

wherein [A] contains monovalent cations of $M_1$, $M_2$ and $M_3$;

$M_1$ is a substituted or unsubstituted ammonium ion, $M_2$ is a substituted or unsubstituted amidine ion, $M_3$ is at least one alkali-metal ion selected from the group consisting of $Cs^+$, $Rb^+$, $Li^+$ and $Na^+$, and the substituents of the $M_1$ and $M_2$ are each $C_{1-20}$ alkyl or $C_{6-20}$ aryl when the $M_1$, $M_2$ is substituted;

[B] is at least one divalent cation selected from the group consisting of $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$; and

[X] is at least two monovalent anions selected from the group consisting of $Br^-$, $SCN^-$, and $OCN^-$.

In another embodiment, the present disclosure takes the precursor composition of the perovskite film including crystal grains with $(FA_{0.8}MA_{0.15}Cs_{0.05})Pb(I_{0.85}Br_{0.15})_3 \cdot n[C]$ structure as an example, and the preparation method of the precursor composition is described as follows:

dispersing or dissolving formamidine hydroiodide (FAI), lead bromide ($PbBr_2$), methylamine hydrobromide (MABr), lead iodide ($PbI_2$), cesium iodide (CsI) and other perovskite precursor salts in a mixed solvent containing γ-butyrolactone and dimethyl sulfoxide sequentially to form a first solution, wherein the molarity of the perovskite precursor salt is 0.1 M to 1.5 M; and the volume ratio of the γ-butyrolactone to dimethyl sulfoxide is 1:10 to 10:1;

dissolving 18-crown-6 in γ-butyrolactone to form a second solution; and adding the dispersant after mixing the first solution and the second solution to obtain the precursor composition, wherein the volume percentage of the dispersant is 5 to 10% in the precursor composition, and the molarity of 18-crown-6 is 0.2 mM to 1.6 mM.

In the precursor composition of the present disclosure, in addition to 18-crown-6, the crown ether compound may also be at least one selected from the group consisting of 12-crown-4, 15-crown-5, 21-crown-7, 24-crown-8, and 30-crown-10.

In the precursor composition of the present disclosure, the dispersant helps to dissolve the conjugate of the crown ether compound and the perovskite precursor, and makes the colloidal particles containing the aforementioned [A], [B], [X] and crown ether compounds uniformly dispersed in the precursor composition. During the film formation process of the perovskite film, the dispersant also has the effect of regulating the solvent evaporation rate, so that the film formation is more uniform and freer from defect formation. Even in a large-area thin film process, the uniformity of the thin film can still be maintained.

In one embodiment, the dispersant may be a $C_{1-5}$ linear alkyl alcohol, such as 1-propanol.

In one embodiment, the precursor composition includes the colloidal particles each with a size of less than 500 nm, and the colloidal particles include the aforementioned [A], [B], [X] and [C]. In other embodiments, the size of each of the colloidal particles is less than 300 nm, but not limited thereto.

As used herein, the term "substrate" generally refers to an article processed according to the present disclosure. The substrate may include a base (such as a semiconductor wafer), or at least one layer (such as a film) on or covering the substrate.

As used herein, the term "heated substrate" is a heating source that provides constant thermal energy to the substrate, so that the substrate can maintain a desired temperature. The position of heating source may include the top, the bottom or the side of the substrate. The heating source is not limited to any form, such as conduction, convection or radiation.

In one embodiment, the heating method of the heated substrate includes coating the precursor composition, while heating the bottom and top of the substrate to accelerate the heat diffusion rate of the substance coated on the surface of the substrate.

In another embodiment, the heating method of the heated substrate includes, but is not limited to: irradiating infrared rays on the upper surface of the substrate, and heating the lower surface of the substrate with a conductive heating source, wherein the temperature of the conductive heating source is 140 to 170° C., and the radiation temperature of infrared rays is 80 to 180° C.

In the preparation method of the present disclosure, the coating method used in the coating step includes slit coating, blade coating, air blade coating, or inkjet coating.

The blade coating system is suitable for industrial-scale production, and the principle of film formation thereof is to control the solvent evaporation rate under high temperatures, so that the nucleation and the growth of the crystal may be performed simultaneously. Therefore, the perovskite film produced by the present disclosure also has a larger grain size and flatter film surface than those produced by other processes.

In one embodiment, the operating temperature of the blade coating is 130 to 180° C., and the speed of the blade coating is 1 to 50 mm/sec; in other embodiments, the operating temperature of the blade coating may be 140, 150, 160, or 170° C., but not limited thereto.

The preparation method of the perovskite film of the present disclosure may further include subjecting the perovskite film to a vacuum degassing treatment of after the step of coating, so as to remove the small residual solvent molecules in the film, wherein the temperature of the degassing treatment is 25 to 100° C., the degree of vacuum is −1 to −100 bar, and the processing time is 1 to 5 minutes.

In addition, the preparation method of the perovskite film of the present disclosure may further include subjecting the perovskite film to an annealing treatment after the step of coating, wherein the annealing temperature is 80 to 150° C., the pressure is normal pressure, and the processing time is 0.5 to 2 hours.

Furthermore, the present disclosure further includes a perovskite film made by the above method, and the perovskite film includes crystal grains with a crystalline structure represented by the following formula:

wherein [A] is a monovalent cation containing $M_1$, $M_2$ and $M_3$; $M_1$ is a substituted or unsubstituted ammonium ion, $M_2$ is a substituted or unsubstituted amidine ion, and $M_3$ is at least one alkali-metal ion selected from the group consisting of $Cs^+$, $Rb^+$, $Li^+$ and $Na^+$, and each of the substituent of the above $M_1$ and $M_2$ is $C_{1-20}$ alkyl or $C_{6-20}$ aryl when being substituted;

[B] is at least one divalent cation selected from the group consisting of $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$;

[X] is at least two monovalent anions selected from the group consisting of $F^-$, $Cl^-$, $Br^-$, $I^-$, $SCN^-$, and $OCN$; and

[C] is a crown ether compound; and n is a value of 0.01 to 10.

As used herein, the term "perovskite film" refers to the crystals in the film having a three-dimensional crystalline structure similar to the mineral perovskite ($CaTiO_3$). In the unit cell in the crystal of the present disclosure, the crystalline structure is represented by [A] [B][X]$_3$.n[C], where the cation [A] is located at (0,0,0), and each of the different cations [A] may be orderly or randomly distributed in the crystal grains. The cation [B] is located at (½, ½, ½), and each of the different cations [B] may be orderly or disorderly distributed in the crystal grains when there are more than one cation [B]. The anion [X] is located at (½, ½, 0), and each anion [X] may be orderly or disorderly distributed in the crystal grains. However, the above-mentioned sites are not limited to symmetric structures, but also asymmetrically distorted structures.

As used herein, the term "crystal grain" refers to the single crystal region that composes the polycrystalline thin film, and the crystalline structure thereof is formed by the continuous extension and arrangement of a plurality of unit cells; the discontinuity of crystalline structure between adjacent crystal grains is the "grain boundary." It should be noted that the crystal grains described herein are in the SEM image with a magnification of 500 times. The size of each of the crystal grains is defined from the observed grain boundary therein. The average size of the crystal grains of the perovskite film obtained in the present disclosure is 200 μm to 300 μm.

In the perovskite film of the present disclosure, the [A] of the said [A][B][X]$_3$. n[C] crystalline structure is the ternary cations $M_1$, $M_2$, and $M_3$, and has a relatively stable crystalline phase compared with conventional perovskite structure, such that it can inhibit the formation of impurities and induce the formation of highly uniform perovskite grains, and thereby improving the quality of the perovskite film in film formation.

In one embodiment, $M_1$ is a methylammonium (MA), and the stoichiometric ratio of $M_1$ ranges from 0.05 to 0.3 in the [A]; and in other embodiments, the stoichiometric ratio of the $M_1$ may range from 0.1, 0.15, 0.2 or 0.25 in [A], but not limited thereto.

In another embodiment, $M_2$ is formamidine (FA), and the stoichiometric ratio of $M_2$ ranges from 0.6 to 0.9 in the [A];

in other embodiments, the stoichiometric ratio of the $M_2$ can range from 0.65, 0.7, 0.75, 0.8 or 0.85 in [A], but not limited thereto.

In another embodiment, $M_3$ is a cesium ion ($Cs^+$), and the stoichiometric ratio of $M_3$ ranges from 0.01 to 0.1 in [A], which shows lower stoichiometric ratio and more stable than that of the conventional perovskite crystalline structure. In other embodiments, the stoichiometric ratio of the $M_3$ may range from 0.02, 0.03, 0.04, 0.05, 0.06, 0.07, 0.08, or 0.09 in the [A], but not limited thereto.

[B] of the [A][B][X]$_3$.n[C] crystalline structure of the perovskite film of the present disclosure is a cation with a size different from that of [A], and the size of the cation [B] is smaller than cation [A].

In one embodiment, [B] is a lead ion ($Pb^{2+}$).

In addition, [X] of the [A][B][X]$_3$.n[C] crystalline structure is a binary anion in the perovskite film of the present disclosure, which has the function of controlling the band gap of the material thereof to match the energy gap of the surface material thereof.

In one embodiment, [X] is an iodide ion ($I^-$) and a bromide ion ($Br^-$), wherein the stoichiometric ratio of the iodide ion ranges from 0.01 to 0.99 in [X], and the stoichiometric ratio of the bromide ion ranges from 0.01 to 0.99 in [X]. In other embodiments, the range of the stoichiometric ratio of the iodide ion in the [X] may be 0.05, 0.1, 0.15, 0.2, 0.25, 0.3, 0.35, 0.4, 0.45, 0.5, 0.55, 0.6, 0.65, 0.7, 0.75, 0.8, 0.85, 0.9 or 0.95, but not limited thereto. In other embodiments, the range of the stoichiometric ratio of the bromide ion in [X] may be 0.05, 0.1, 0.15, 0.2, 0.25, 0.3, 0.35, 0.4, 0.45, 0.5, 0.55, 0.6, 0.65, 0.7, 0.75, 0.8, 0.85, 0.9 or 0.95, but not limited thereto.

[C] of the [A][B][X]$_3$.n[C] crystalline structure uses a crown ether compound in the perovskite film of the present disclosure. The crown ether compound has the auxiliary effect of crystal growth and translocation. The reason is that the crown ether compound may be coupled with the perovskite precursor first to effectively reduce the agglomeration phenomenon in the precursor composition during the film forming process of the perovskite film. The crown ether compound also helps to disperse the nucleation points and nucleate uniformly, so as to optimize the arrangement of crystal lattice. At the same time, the crown ether compound can also assist the crystal grains thereof to grow uniformly to form highly uniform and highly crystalline grains with the [A][B][X]$_3$.n[C] crystalline structure.

As used herein, the perovskite precursor refers to the perovskite precursor salt that has been dispersed or dissolved.

In one embodiment, the crown ether compound is at least one selected from the group consisting of 12-crown-4, 15-crown-5, 18-crown-6, 21-crown-7, 24-crown-8, and 30-crown-10.

On the other hand, the crown ether compound will appear on the surface of the perovskite film. Therefore, the perovskite film has a characteristic peak in the range of 1100 to 1300 $cm^{-1}$ in the Fourier transform infrared spectrum. With the protective effect provided by the crown ether compound, it solves the problem of impurity adsorption, sticking, etc. on the surface of the perovskite film, which improves the reproducibility of the performance of elements.

Compared with the conventional perovskite crystalline structure, the growth rate of the crystal grains of the perovskite film tends to be uniform, and no impurities or defects exist in the crystalline structure due to the sufficiently dispersed nucleation point of the crystal grains, so the undulation of the grain boundary is relatively gentle, and the average grain size is 200 to 300 microns.

On the other hand, the crystal grains of the perovskite film of the present disclosure are gradually grown outwards from the nucleation point as the center, so they have a radially symmetric morphology from the center outward. There are no impurities or defects as mentioned above. Therefore, the morphology of the crystal grains of the perovskite film of the present disclosure is also much flatter, which can effectively reduce the barriers of lateral transmission of electrons and increase the electron conductivity.

In one embodiment, the perovskite film of the present disclosure includes crystal grains with a crystalline structure represented by $(FA_{0.8}MA_{0.15}Cs_{0.05})Pb(I_{0.85}Br_{0.15})_3 \cdot n[C]$, wherein [C] is 18-crown-6, and n is a value of from 0.01 to 10.

On the other hand, the present disclosure provides a semiconductor element including the perovskite film as described above.

As used herein, the term "semiconductor element" refers to an element that includes semiconductor materials. Common examples include photoelectric elements, discrete elements, and integrated circuits.

As used herein, the term "photoelectric element" or "photoelectric conversion element" refers to the electronic elements that utilize the photoelectric effect. Common examples include photovoltaic elements (such as solar cells), photodiodes, photodetectors, photoelectric sensors, phototransistors, photomultipliers, photoresistors, light-emitting elements, light-emitting diodes, lasers, and charge injection lasers.

In one embodiment, the semiconductor element is a solar cell.

In the semiconductor element of the present disclosure, the thickness of the perovskite film is 0.6 to 2 microns.

In one embodiment, the semiconductor element includes an n-type region of at least one n-type layer; a p-type region of at least one p-type layer; and a semiconductor material layer between the n-type region and the p-type region, wherein the semiconductor material layer is the perovskite film as mentioned above.

As used herein, the term "n-type layer" refers to a layer of an n-type semiconductor, and the n-type semiconductor may be selected from the compound having electron-transporting properties, which is one from the group consisting of metal oxides, metal sulfides, metal selenides, and metal tellurium compounds, perovskite, amorphous silicon, n-type IV semiconductor, n-type III-V semiconductor, n-type II-VI semiconductor, n-type I-VII semiconductor, n-type IV-VI semiconductor, n-type V-VI semiconductor, and n-type II-V semiconductor, wherein any one of those may be doped or undoped. Generally, the n-type layer may include $TiO_2$, $SnO_2$, ZnO, $Nb_2O_5$, $Ta_2O_5$, $WO_3$, $W_2O_5$, $In_2O_3$, $Ga_2O_3$, $Nd_2O_3$, PbO, or CdO.

In one embodiment, the n-type region is a dense layer of $TiO_2$.

As used herein, the term "p-type layer" refers to a layer of a p-type semiconductor, and the p-type semiconductor may be selected from polymers or compounds having hole-transporting properties, or inorganic dense layers having hole-transporting properties.

In one embodiment, the p-type layer is a polymer with hole-transporting properties. Generally, the polymer with hole-transporting properties may include 2,2',7,7'-tetrakis [N,N-di(4-p-methoxyphenyl)amino]-9,9'-spirobifluorene (spiro-OMeTAD), poly(3-hexylthiophene) (P3HT), poly [2,6-(4,4-bis-(2-ethylhexyl)-4H-cyclopenta [2,1-b; 3,4-b]dithiophene)-alt-4,7(2,1,3-benzothiadiazole)] (PCPDTBT), poly(9-vinylcarbazole) (PVK) or polymers containing p-type metal oxide.

In one embodiment, the p-type region is a layer of spiro-OMeTAD material.

In another embodiment, the semiconductor element includes: an n-type region of at least one n-type layer; a p-type region of at least one p-type layer; and a semiconductor material layer between the n-type region and the p-type region, wherein the semiconductor material layer includes a porous scaffold layer and a perovskite film as mentioned above.

As used herein, the term "porous scaffold layer" includes a porous layer composed of a dielectric material or a charge transport material, and the structure of the pores may be microporous, mesoporous or macroporous.

The term "microporous structure" refers to the average pore size of the pores being less than 2 nm; the term "mesoporous structure" refers to the average pore size of the pores being equal to or greater than 2 nm to less than 50 nm; and the term "macroporous structure" refers to the average pore size of the pores being equal to or greater than 50 nm. The size of each of the pores in the structure may be different, and may be of any shape.

As used herein, the term "dielectric material" refers to a material with a band gap being equal to or greater than 4.0 eV; and the term "charge transport material" includes electron transport materials or hole transport materials. In one embodiment, the electron transport material may be an n-type semiconductor material, and the hole transport material may be a p-type semiconductor material.

In one embodiment, the porous scaffold layer is a layer with a mesoporous structure composed of electron transport materials, such as titanium dioxide.

In another embodiment, the semiconductor element further includes a first electrode in contact with the n-type region; and a second electrode in contact with the p-type region.

As used herein, said "first electrode" and said "second electrode" may include any suitable conductive material, which can be deposited to form a single layer or multiple layers, and also can be patterned.

In one embodiment, the first electrode includes a transparent conductive oxide, such as a fluorine-doped tin oxide (FTO) transparent conductive film, an indium tin oxide (ITO) transparent conductive film, or an aluminum zinc oxide (AZO) transparent conductive film; and the second electrode includes one or more metals, such as silver, gold, copper, aluminum, platinum, palladium, or tungsten.

In another embodiment, the first electrode is a fluorine-doped tin dioxide (FTO) transparent conductive film, and the second electrode is gold.

The present disclosure will be described in detail through Examples, which are not considered to limit the scope of the present disclosure.

EXAMPLES

Example 1-1

Preparation of a precursor composition: γ-butyrolactone and dimethyl sulfoxide were used as the mixed solvent of the precursor composition. The perovskite precursor salt of the precursor composition included formamidine hydroiodide (FAI), lead bromide ($PbBr_2$), methylamine hydrobromide (MABr), lead iodide ($PbI_2$), and cesium iodide (CsI).

First, the perovskite precursor salts including formamidine hydroiodide (FAI), lead bromide ($PbBr_2$), methylamine hydrobromide (MABr), lead iodide ($PbI_2$), cesium iodide (CsI) were dispersed or dissolved in the mixed solvent sequentially to form a first solution, wherein the molarity of the formamidine hydroiodide was 0.159 M, the molarity of the lead bromide was 0.159 M, and the molarity of the methylamine hydrobromide was 0.159 M, the molarity of the lead iodide was 0.9 M, and the molarity of the cesium iodide is 1.35 M. The volume ratio of the γ-butyrolactone and dimethyl sulfoxide was 5:1.

18-crown-6 was dissolved as a crown ether compound in γ-butyrolactone to form a second solution.

Then, the first solution and the second solution were mixed. Finally, 1-propanol was added as a dispersant, and it became the precursor composition for preparing the perovskite film after stirring, wherein the volume percentage of the dispersant was 7.5% in the precursor composition, and the molarity of the 18-crown-6 was 0.85 mM.

Figure 2A:
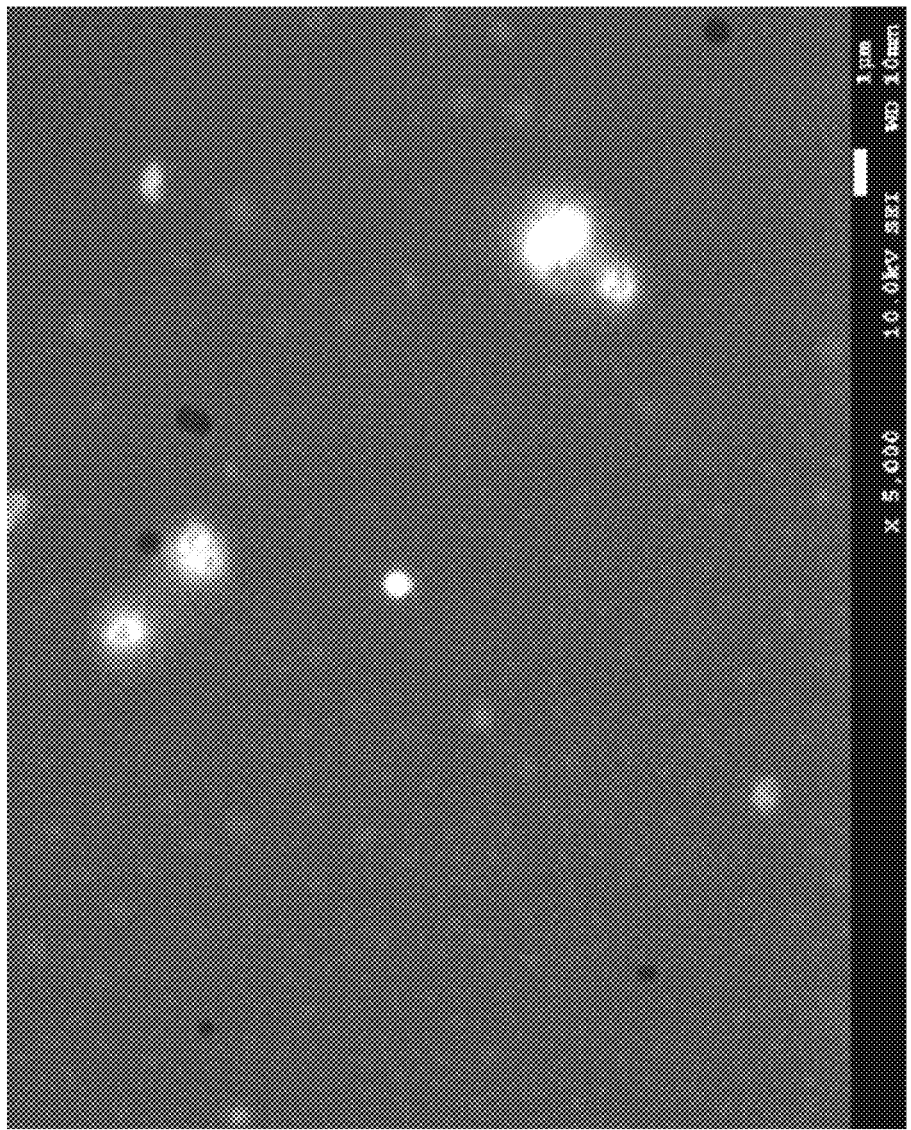
FIGS. 2A to 2C are the topographies of the colloidal particle of the precursor composition of example 1-1, comparative example 1-1, and comparative example 1-2 of the present disclosure observed by a transmission electron microscope, respectively.

The appearance and size of the colloidal particles in the precursor composition were observed by a transmission electron microscope (Carl Zeiss, Inc, SUPRA™ 55 VP, Germany; AMETEK, Inc, PV77-58120ME), and recorded in FIG. 2A. Further, it can be seen that the sizes of colloidal particles in the precursor composition of the present disclosure were less than 500 nm without agglomeration.

Preparation of a perovskite film: A substrate was placed on a heater, and heated to 150° C. The precursor composition was applied to the heated substrate by blade coating. The upper surface of the substrate was irradiated by infrared rays, while the lower surface of the substrate was heated by a conductive heating source, wherein the irradiation temperature of infrared rays was from 80 to 180° C., the operating temperature of the blade coating was from 150° C., the speed of the blade coating was 15 mm/sec, and the gap between the blade and the substrate was 250 microns.

Figure 3:
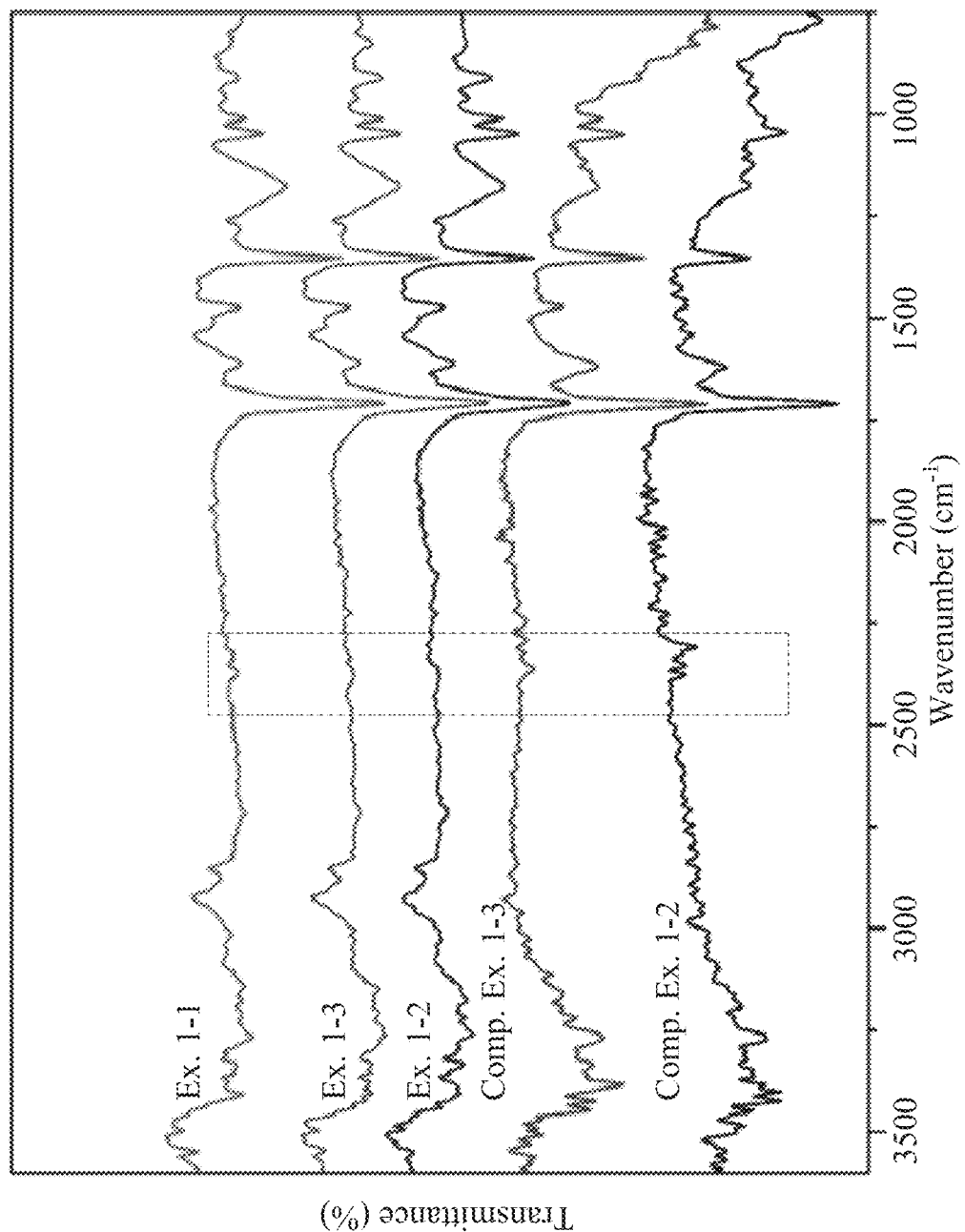
FIG. 3 is a Fourier transform infrared spectrum of the surfaces of the perovskite films after the degassing treatment in the examples and the comparative examples of the present disclosure.

After completing the coating, the perovskite film was subjected to a high-temperature degassing treatment, wherein the temperature of the degassing treatment was 100° C., the degree of vacuum is −1 bar (bar), and the time of treatment was 5 minutes. The adsorbed molecules on the surface of the film were analyzed by the Fourier transform infrared spectrometer (Thermo Fisher Scientific, Inc, Nicolet spectrometer), and recorded in FIG. 3. The characteristic peak of stretching vibration of the carbon dioxide molecules was marked with dot-line frame. It can be seen that no adsorption of the carbon dioxide molecules occurred on the surface of the perovskite film.

Then, the perovskite film was further subjected to an annealing treatment, wherein the temperature of the annealing treatment was 100° C., the pressure was normal, and the time of the treatment was 1 hour. A perovskite film having thickness of 0.61 micron including grains with $(FA_{0.8}MA_{0.15}Cs_{0.05})Pb(I_{0.85}Br_{0.15})_3 \cdot n[C]$ structure was obtained, wherein the [C] was 18-crown-6.

Figure 4:
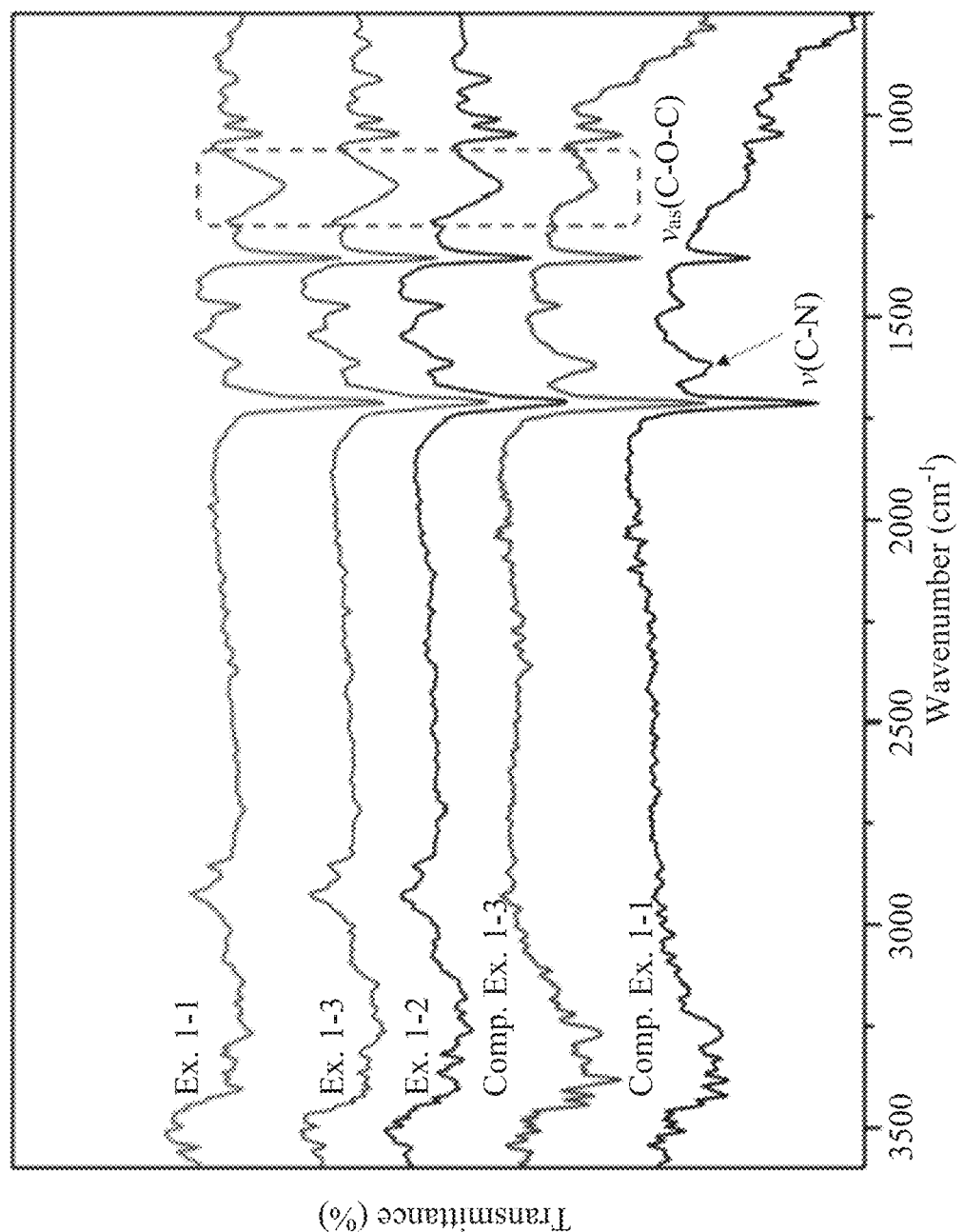
FIG. 4 is a Fourier transform infrared spectrum of the surfaces of the perovskite films after the degassing treatment and annealing treatment in the examples and the comparative examples of the present disclosure.
Figure 5A:
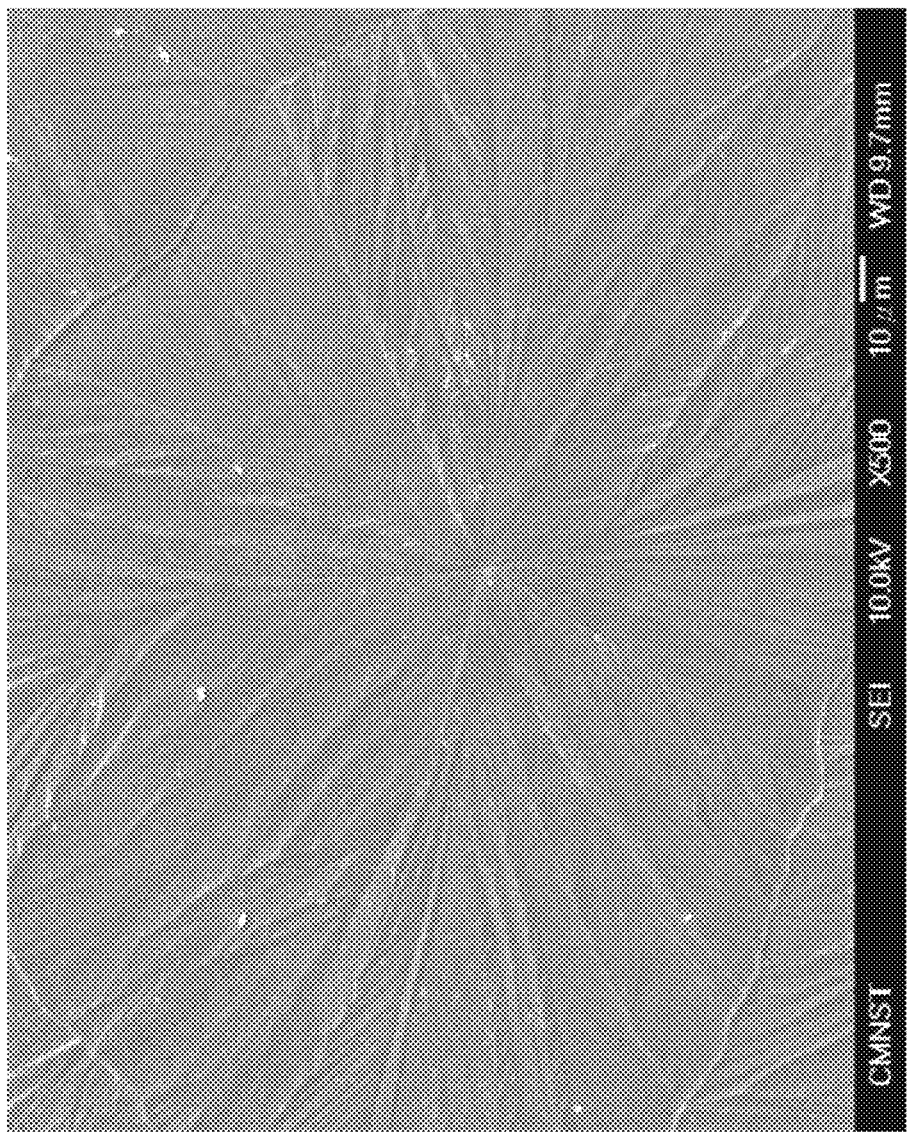
FIGS. 5A to 5G are surface views of the perovskite films of example 1-1, example 1-2, example 1-3, comparative example 1-2, comparative example 1-3, and comparative example 1-4 of the present disclosure observed by a scanning electron microscope, where

Finally, the perovskite film prepared above was analyzed as follows:

(1) Surface observation: the Fourier transform infrared spectrometer was used to determine the characteristic peaks of the surface of film, and recorded in FIG. 4. The characteristic peaks can be seen in the range of 1100 to 1300 $cm^{-1}$; and the morphology and size of the crystal grains on the surface of the perovskite film were observed by scanning electron microscope (Germany Carl Zeiss, Inc, SUPRA™ 55VP; AMETEK, Inc, PV77-58120ME), and recorded in FIG. 5A. It is obvious that the crystal grains of the perovskite film of the present disclosure were flat, and the size thereof is about 275 microns, and had a radially symmetric morphology from the center outward.

Figure 6A:
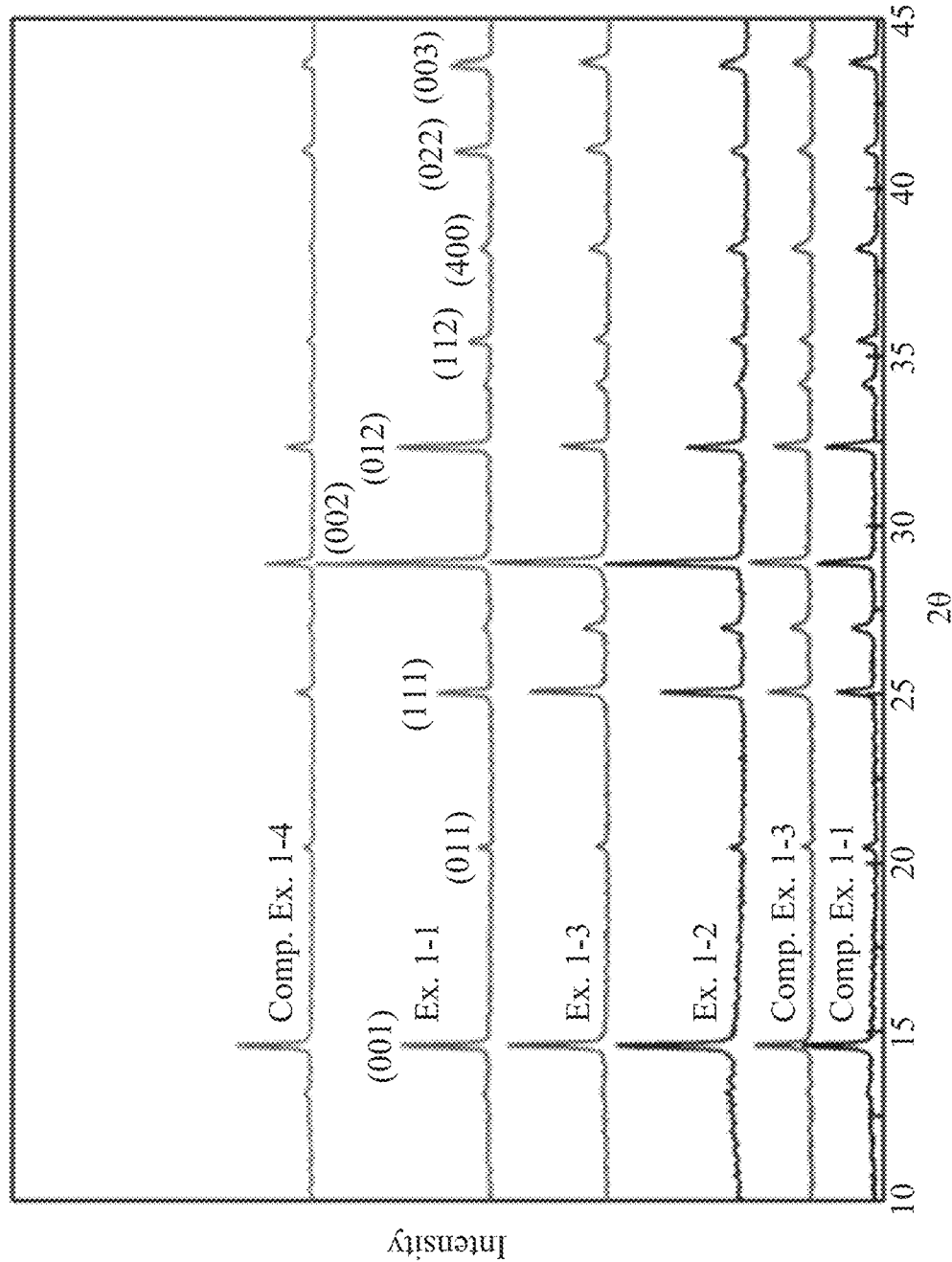
FIG. 6A is an X-ray diffraction spectrum of the perovskite films of the examples and the comparative examples of the present disclosure.
Figure 6B:
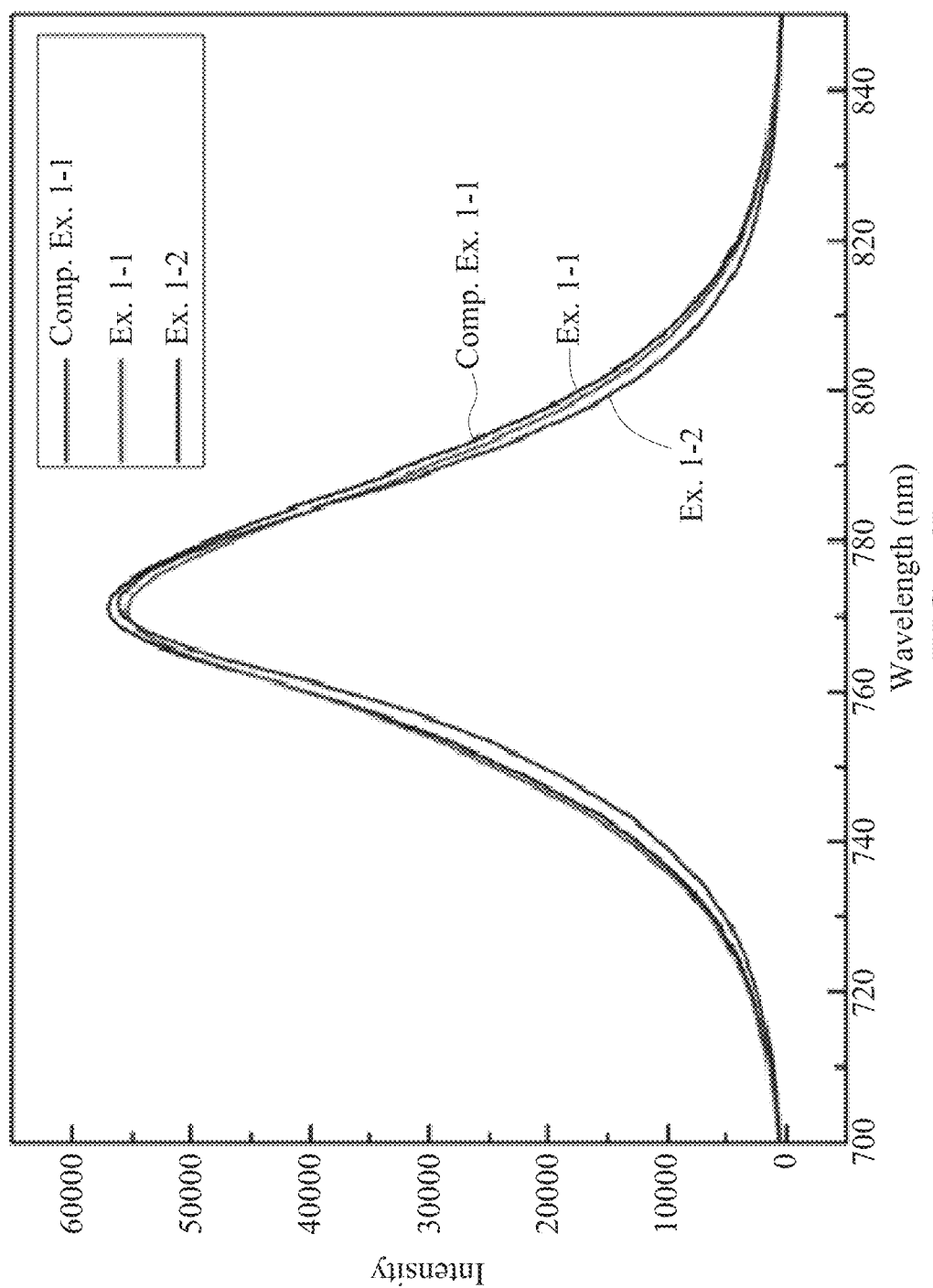
FIG. 6B is a photoluminescence spectrum of the perovskite films of the examples and the comparative examples of the present disclosure.

(2) Crystallinity: the crystalline structure of the film was analyzed by an X-ray diffraction analyzer (Bruker, D8, Germany), and the crystalline structure was measured by a photoluminescence (PL) spectrometer (Jinghong Technology Co., Ltd., UniDRON). The half-height width of the crystalline are recorded in FIG. 6A and FIG. 6B, respectively. With a stronger crystallization signal and a narrower half-height width in the X-ray diffraction spectrum, it is obvious that the crystallinity of the perovskite film of the present disclosure is significantly improved.

Figure 7:
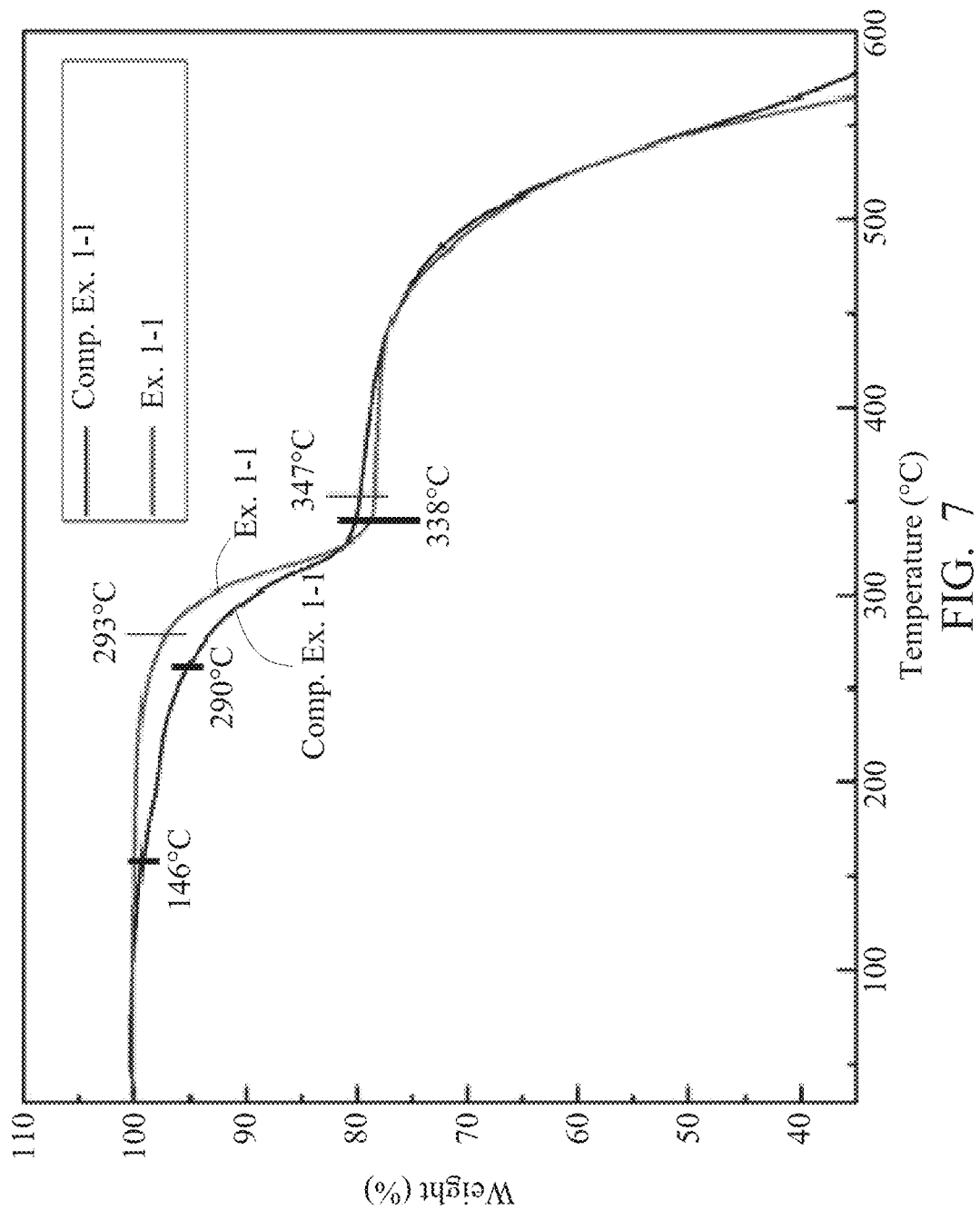
FIG. 7 is a thermogravimetric curve graph of the perovskite films of the examples and comparative examples of the present disclosure measured by a thermogravimetric analyzer.

(3) Residue of solvent: the amount of the residual solvent in the film was analyzed by a thermogravimetric analyzer (PerkinElmer, TGA 400) at a heating rate of 1° C./min, and recorded in FIG. 7, which shows that there was no residue of small molecules of solvent remained in the perovskite film.

Examples 1-2 to 1-3: Preparations of the Perovskite Films

Figure 5B:
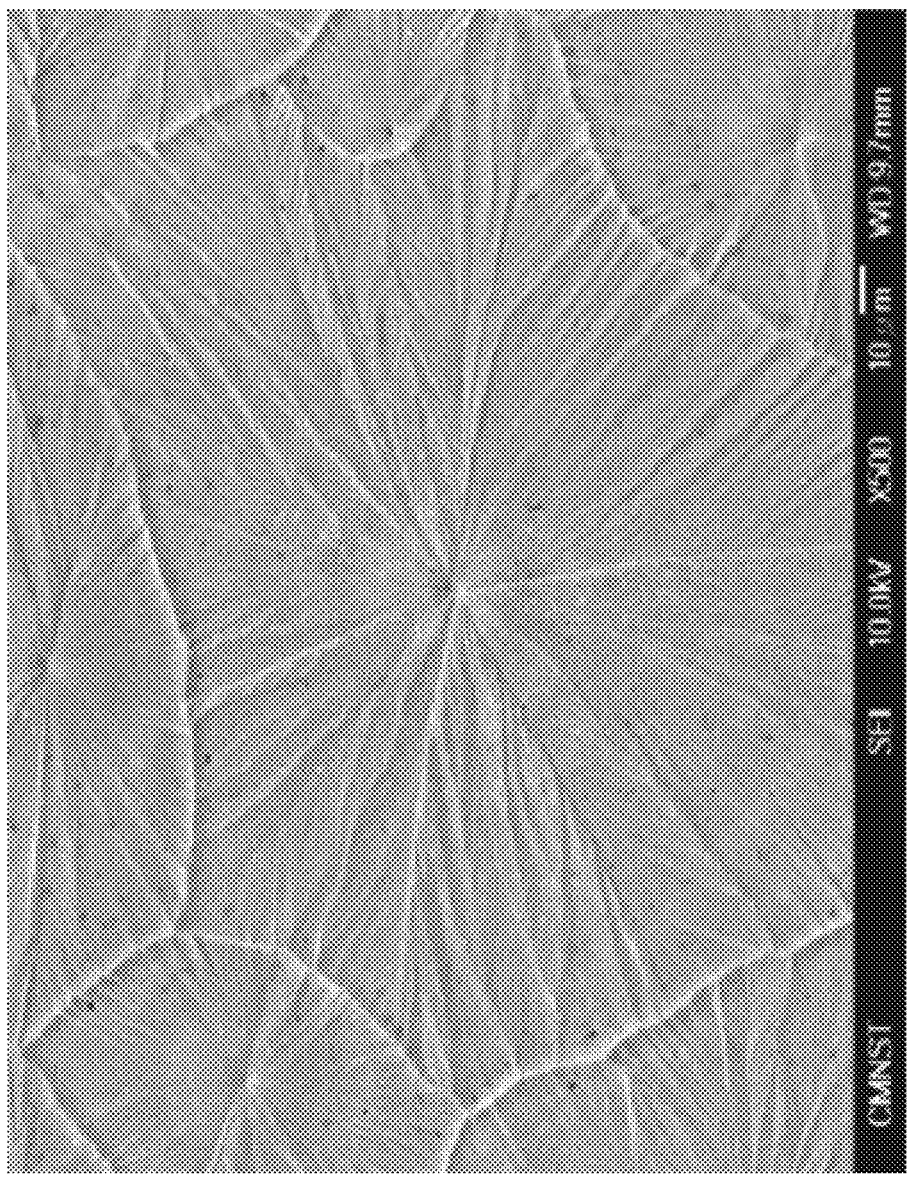
Figure 5C:
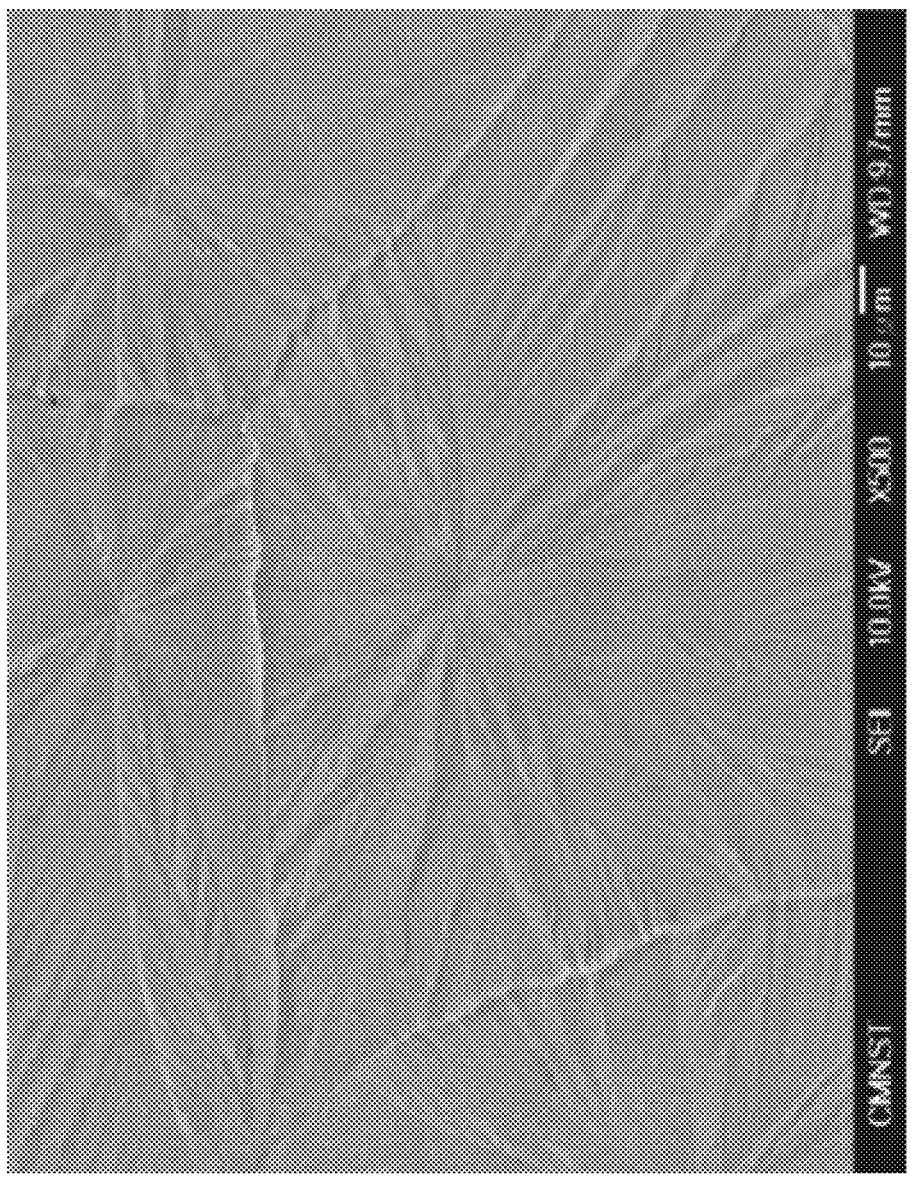

The perovskite films were prepared by the same method as described in Example 1-1, except that the molarities of 18-crown-6 in the precursor compositions were 0.25 mM and 0.45 mM, respectively. Further, the surface observation and crystallinity analysis of the formed perovskite film were performed and recorded in FIGS. 3, 4, 5B, SC, 6A, and 6B.

Comparative Example 1-1

Figure 2B:
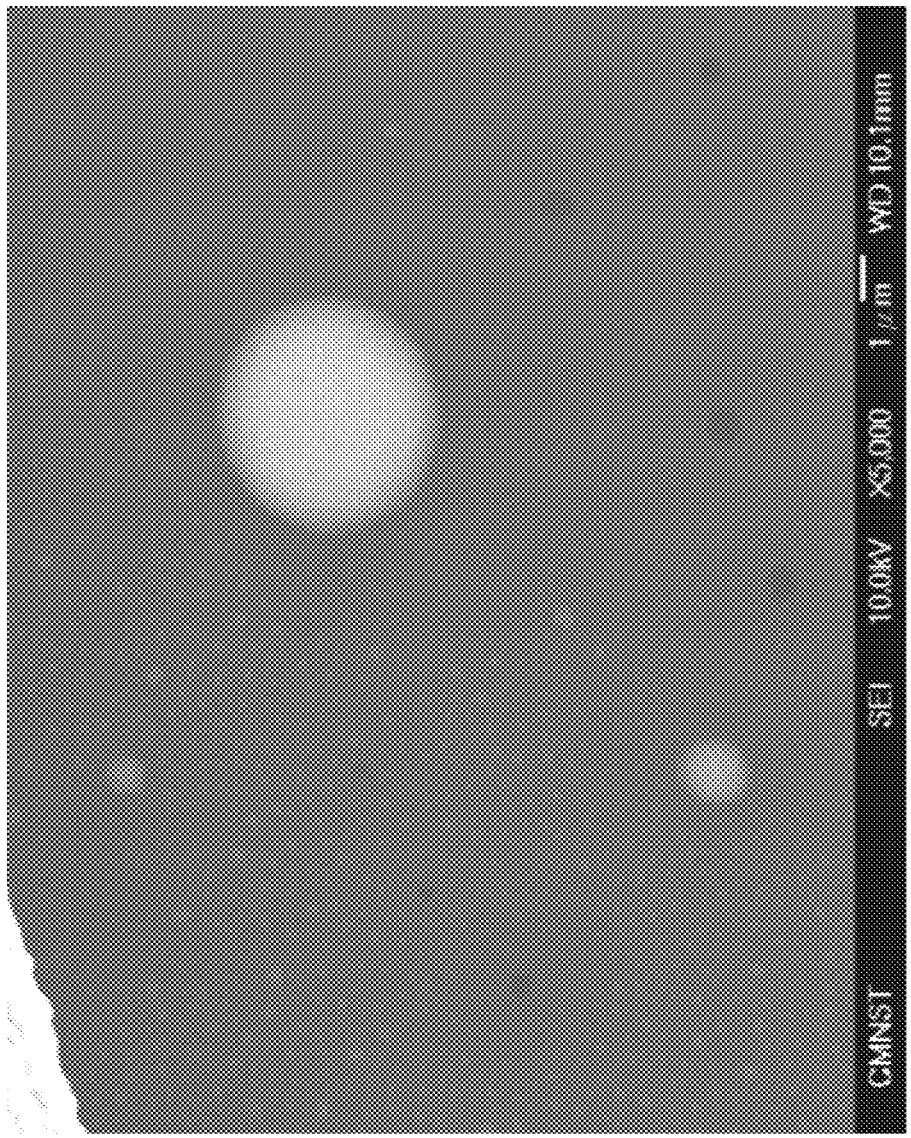

The precursor composition was prepared by the same method as described in Example 1-1 but without 18-crown-6, and the appearance and size of the colloidal particles in the precursor composition were observed by a transmission electron microscope, and recorded in FIG. 2B. Then, the perovskite film was formed according to the method of Example 1-1, and the analysis of surface observation, crystallinity and residue of solvent of the perovskite film prepared were performed and recorded in FIGS. 4, 6A, 6B, 7, 8A, and 9.

In the Fourier transform infrared spectrum shown in FIG. 4, the perovskite film made without crown ether compound has no characteristic peak of $v_{as}$ (COC) in the range of 1100 to 1300 cm$^{-1}$. It can be seen from FIGS. 6B and 7 that the perovskite film prepared did not contain crown ether compounds, the half-height width thereof was 5.1 nm longer than that with crown ethers added, and the crystallinity thereof was inferior to crown ether compounds. In addition, due to no protection of the passivation layer formed by the crown ether compound on the surface of the film, there were small molecules of solvent remaining in the film, resulting in an adverse effect on the performance thereof.

Comparative Example 1-2

Figure 5D:
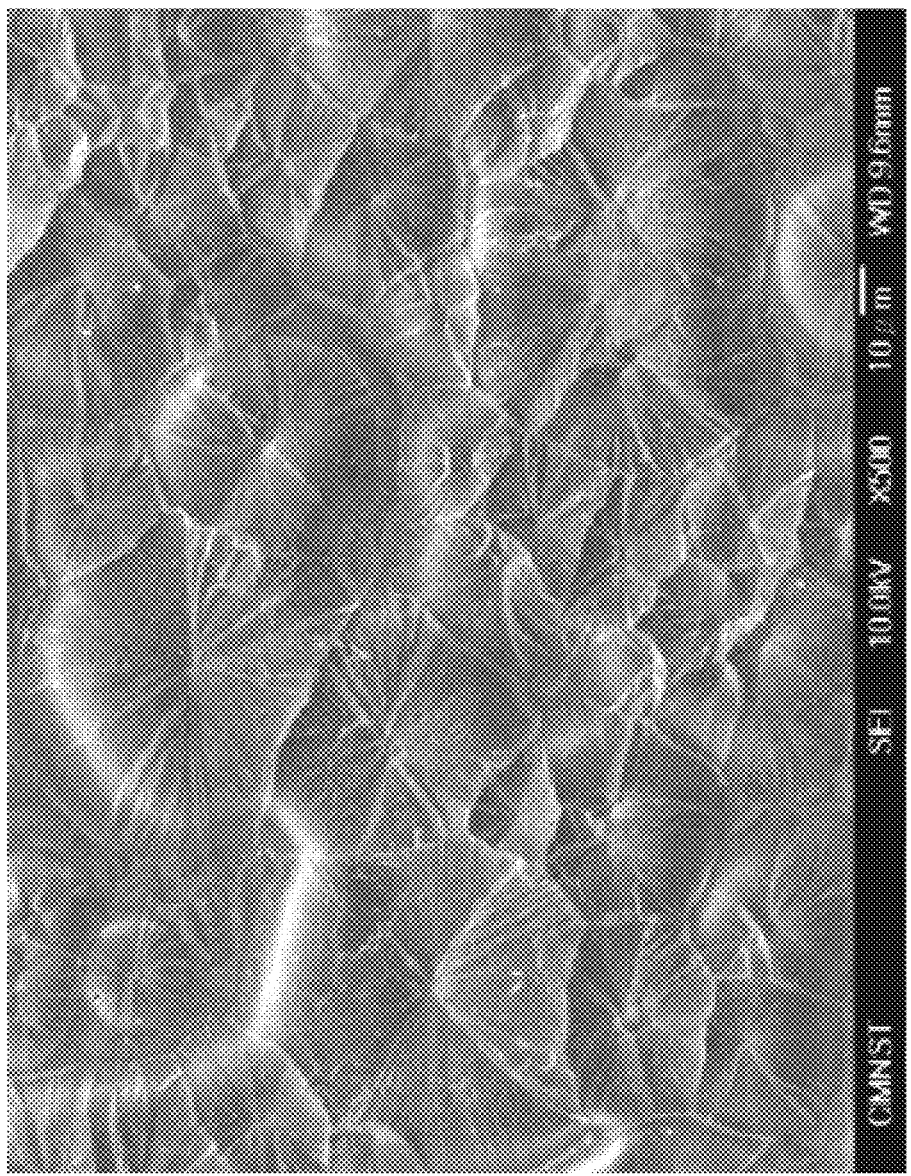
Figure 5E:
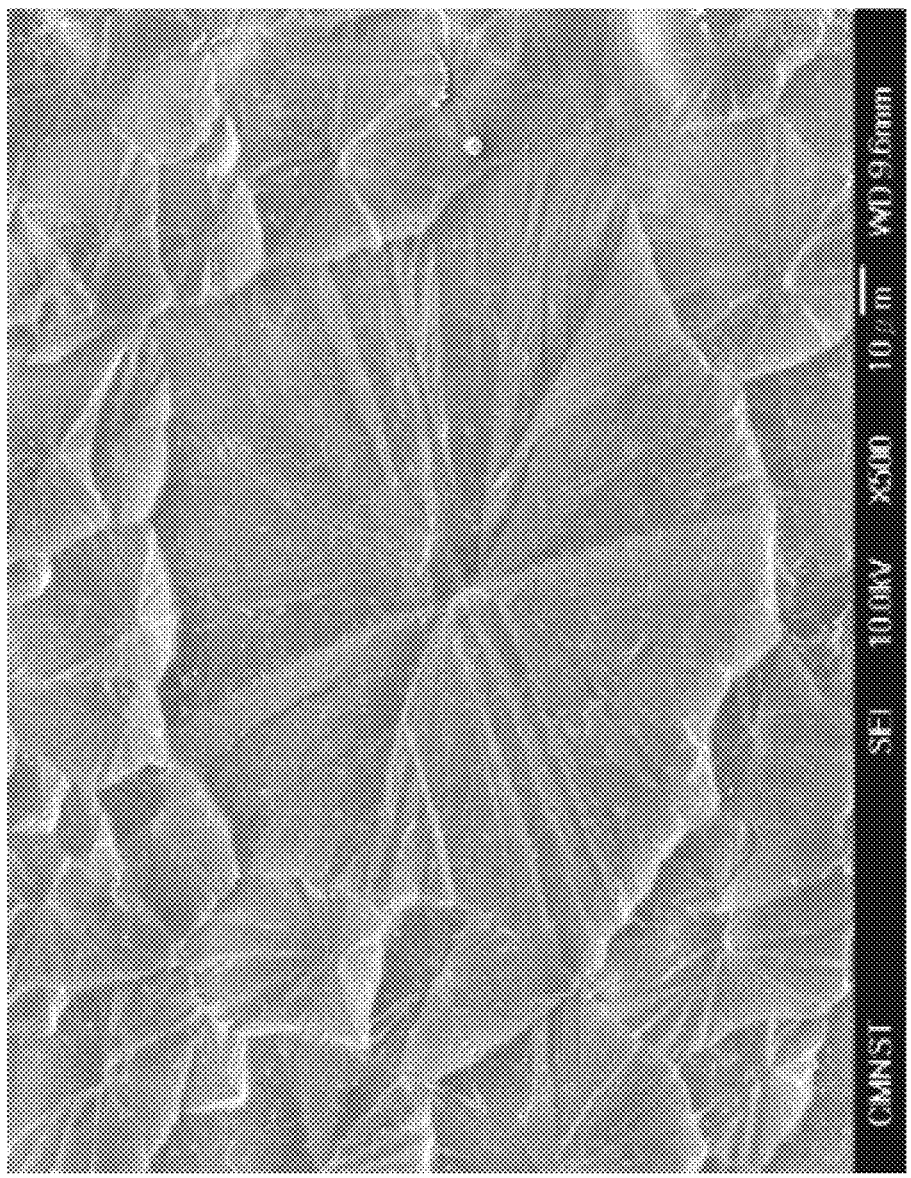

The precursor composition was prepared by the same method as described in Example 1-1, except that the molarity of 18-crown-6 was 0.005 mM in the precursor composition. The perovskite film was formed according to the method in Example 1-1, and the analysis of surface observation of the perovskite film prepared were performed and recorded in FIGS. 3 and 5D.

From the above, it was difficult to achieve the auxiliary effect of the crystal growth and translocation when the concentration of the crown ether compound was too low in the film. Therefore, it can be seen in FIG. 5D that the state of the nucleation and alignment of the crystal grains in the film were not good, and affected the flatness of the overall film surface. In addition, it was easy for the surface of film to absorb carbon dioxide molecules, so that the characteristic peaks of the stretching vibration of carbon dioxide molecules were seen at the dotted line marked in FIG. 3, which resulted in an adversely effect of the performance thereof.

Comparative Example 1-3

Figure 2C:
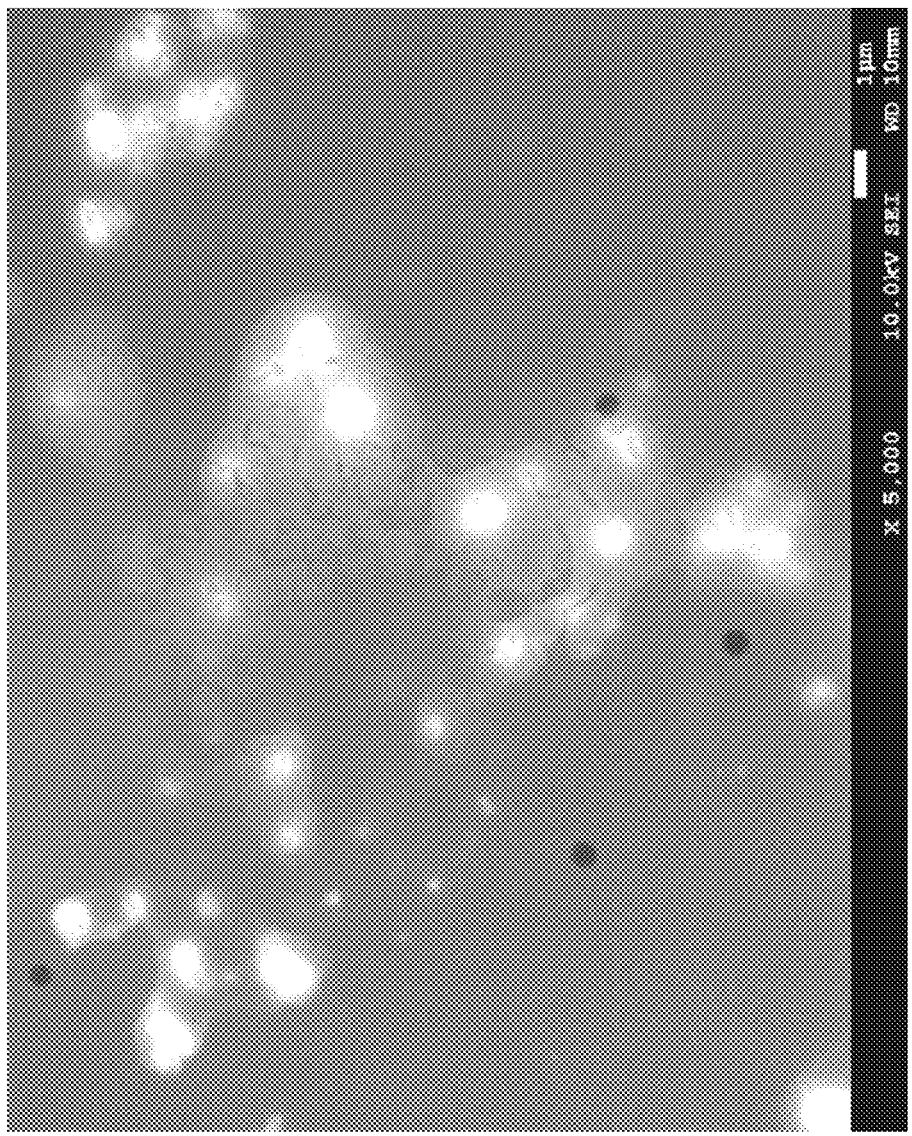

The perovskite film was prepared by the same method as described in Example 1-1, except that the molarity of 18-crown-6 was 0.05 mM in the precursor composition, and the appearance and size of the colloidal particles in the precursor composition were observed by a transmission electron microscope and recorded in FIG. 2C. Then, the analysis of surface observation and crystallinity of the perovskite film produced were carried out and recorded in FIGS. 3, 4, 5E, and 6A.

Comparative Example 1-4

Figure 5F:
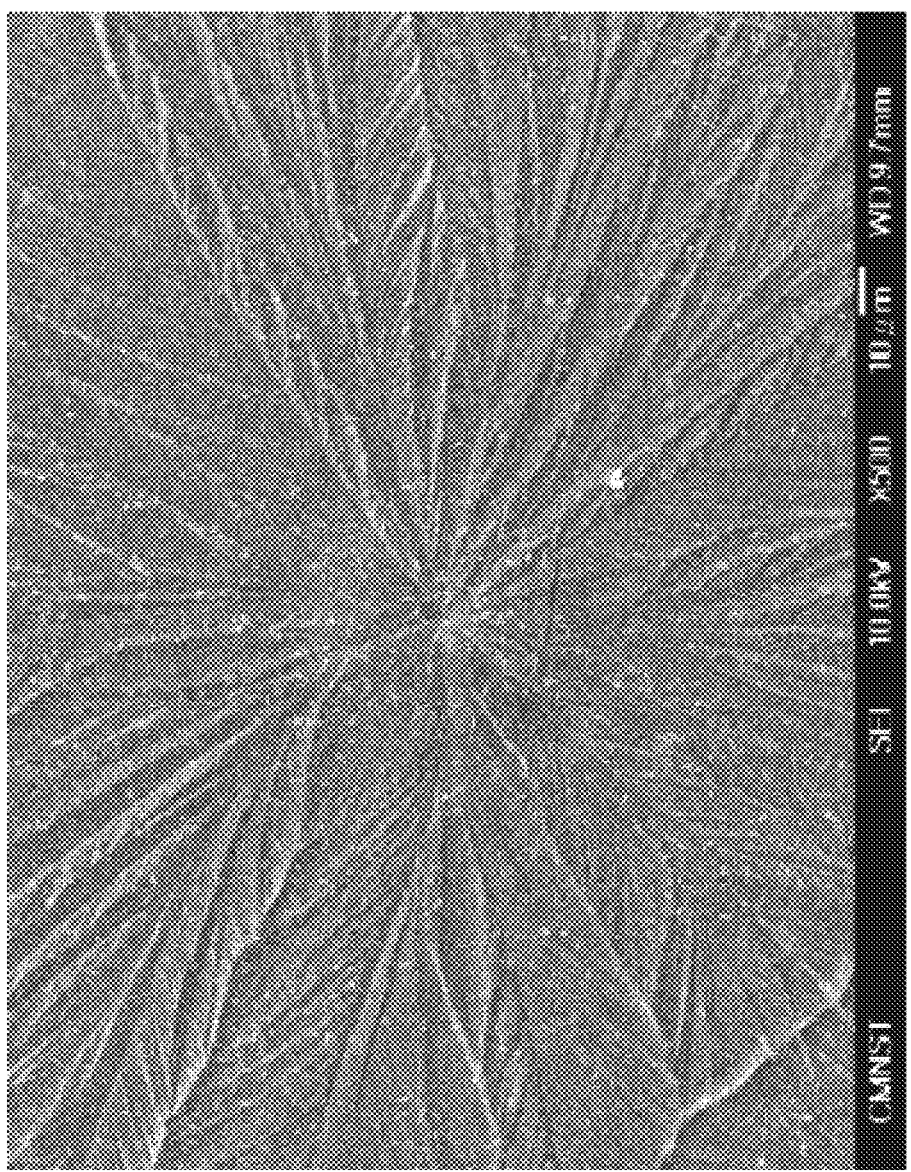
Figure 5G:
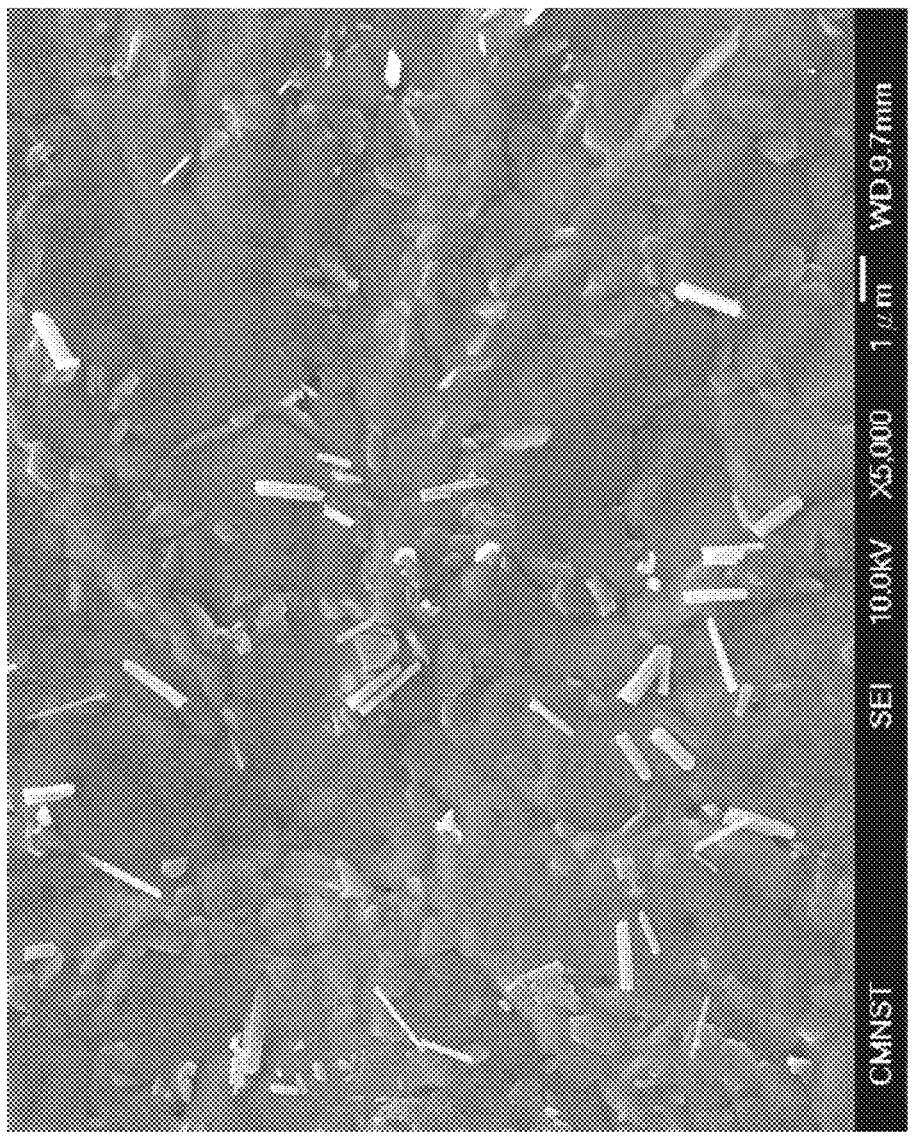

The perovskite film was prepared by the same method as described in Example 1-1, except that the molarity of 18-crown-6 was 1.9 mM in the precursor composition. Then, the surface of the perovskite film produced was observed and recorded in FIG. 5F. FIG. 5G is an enlarged view of FIG. 5F, and in which the precipitated impurities can be seen. Further, the analysis of crystallinity of the perovskite film produced was performed and recorded in FIG. 6A.

Comparative Example 1-5

The perovskite film was prepared by the same method as described in Comparative Example 1-1, but without the dispersant 1-propanol. Then, the surface and crystallinity analysis of the perovskite film prepared was carried out and recorded in FIG. 8B and FIG. 9.

Figure 8A:
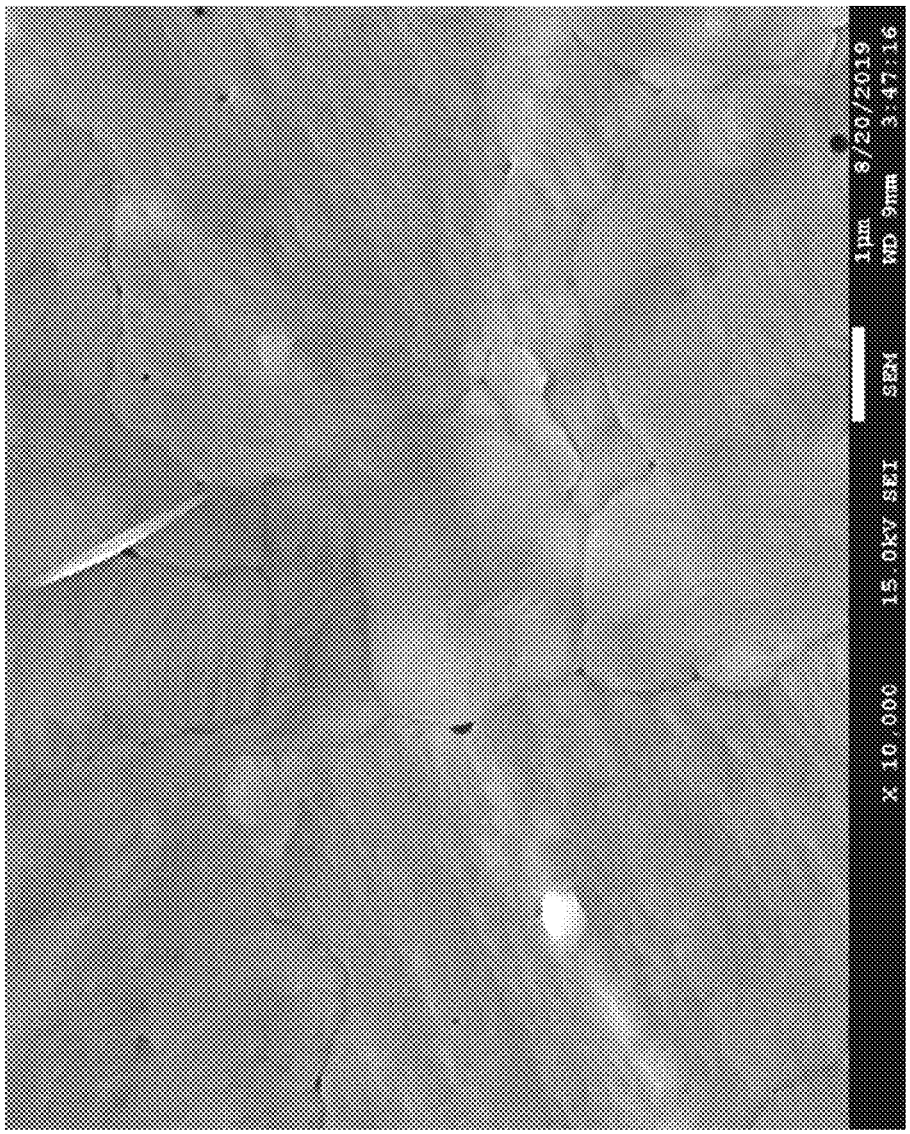
FIGS. 8A and 8B are surface views of the perovskite films of comparative example 1-1 and comparative example 1-5 observed by a scanning electron microscope.
Figure 8B:
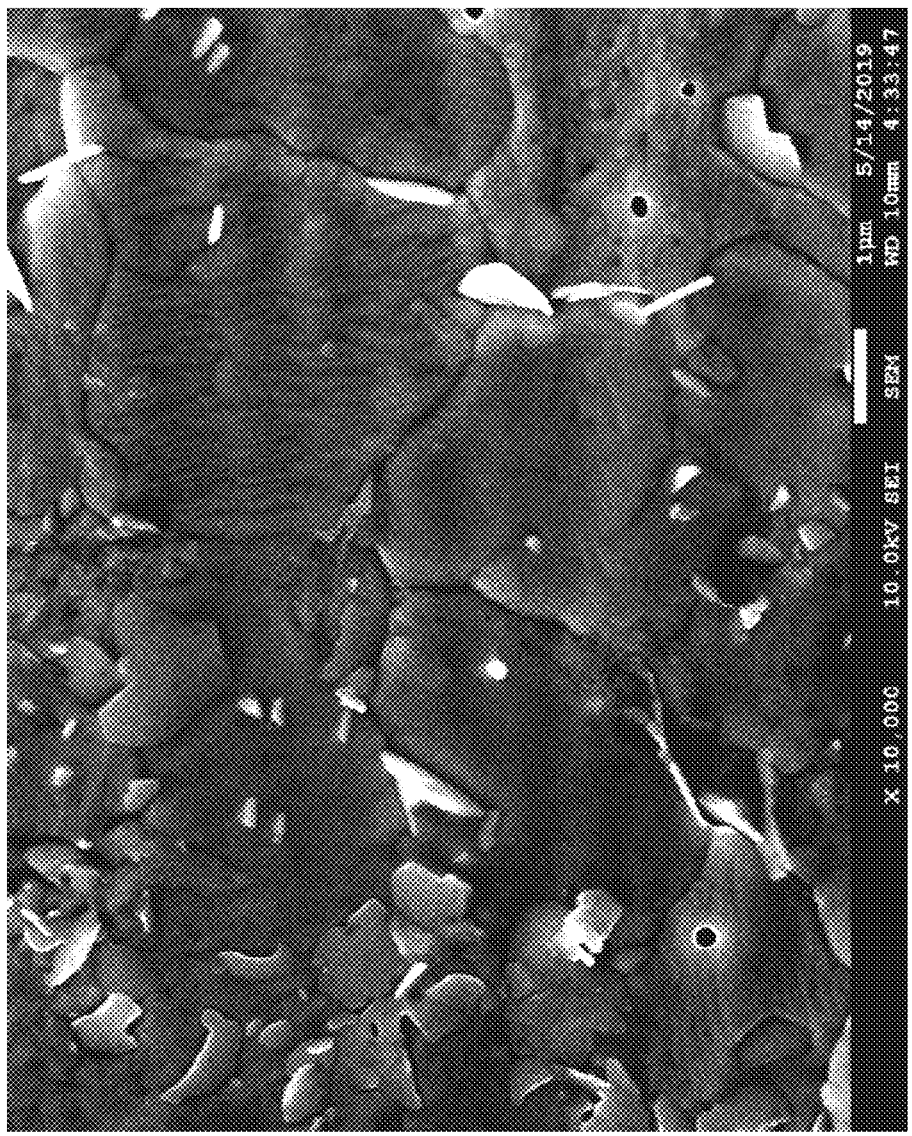

From the result above, it can be seen that impurities, such as PbI$_2$, would precipitate in the film during the formation process of the perovskite film, if no dispersant was used (see FIG. 9), and it is obvious in FIG. 8B that the surface was also prone to defects formation, which seriously affected its quality of film formation.

Comparative Example 1-6

The perovskite film was prepared by the same method as described in Comparative Example 1-5, except that the solvent in the precursor composition was dimethylformamide (DMF). Then, the crystallinity of perovskite film prepared was analyzed and recorded in FIG. 9.

Figure 9:
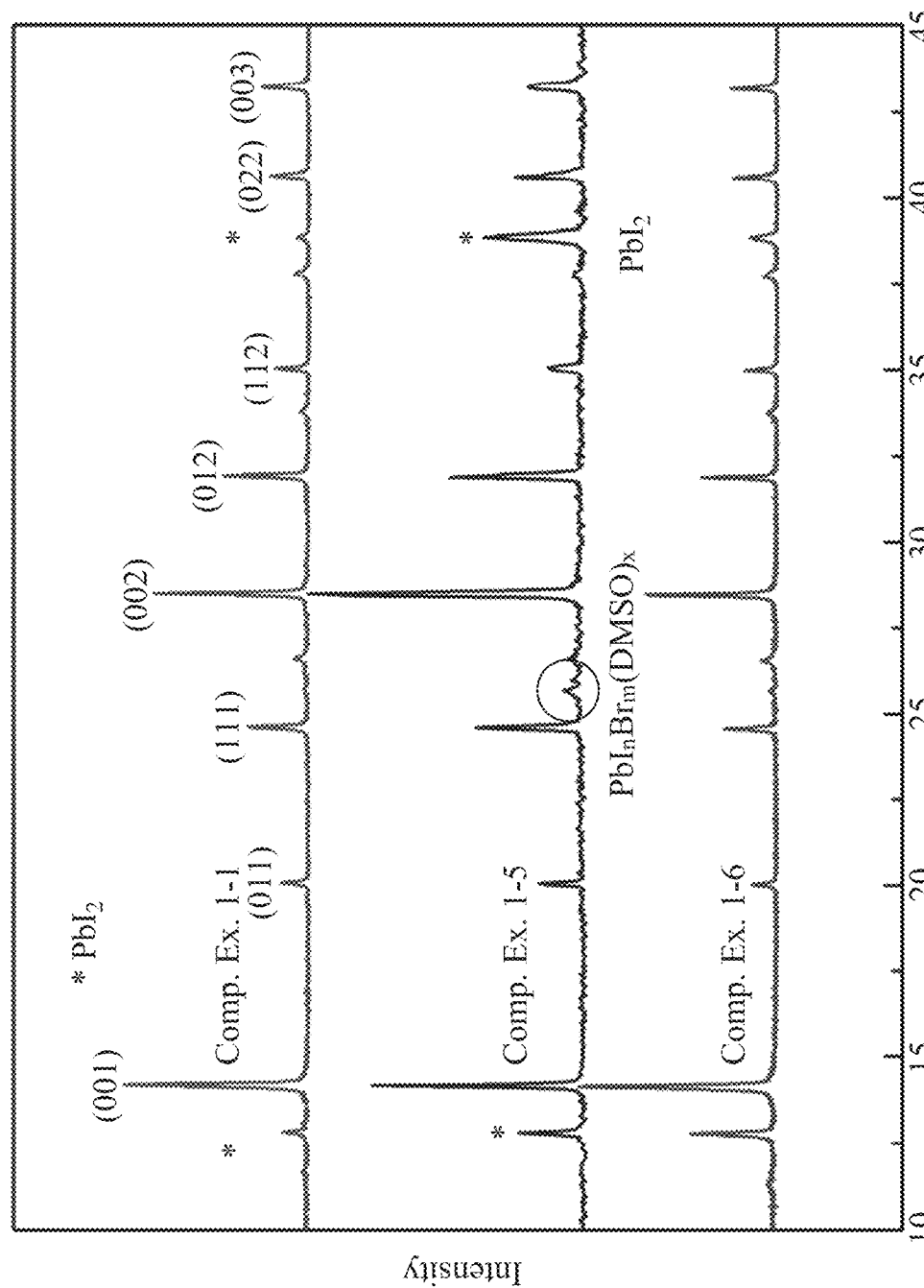
FIG. 9 is an X-ray diffraction spectrum of the perovskite film of the comparative examples of the present disclosure.

From the result above, it can be seen that the impurities, such as PbI$_2$, precipitated, when using conventional processing solvent (DMF) for film formation (see FIG. 9).

Comparative Example 1-7

Figure 10:
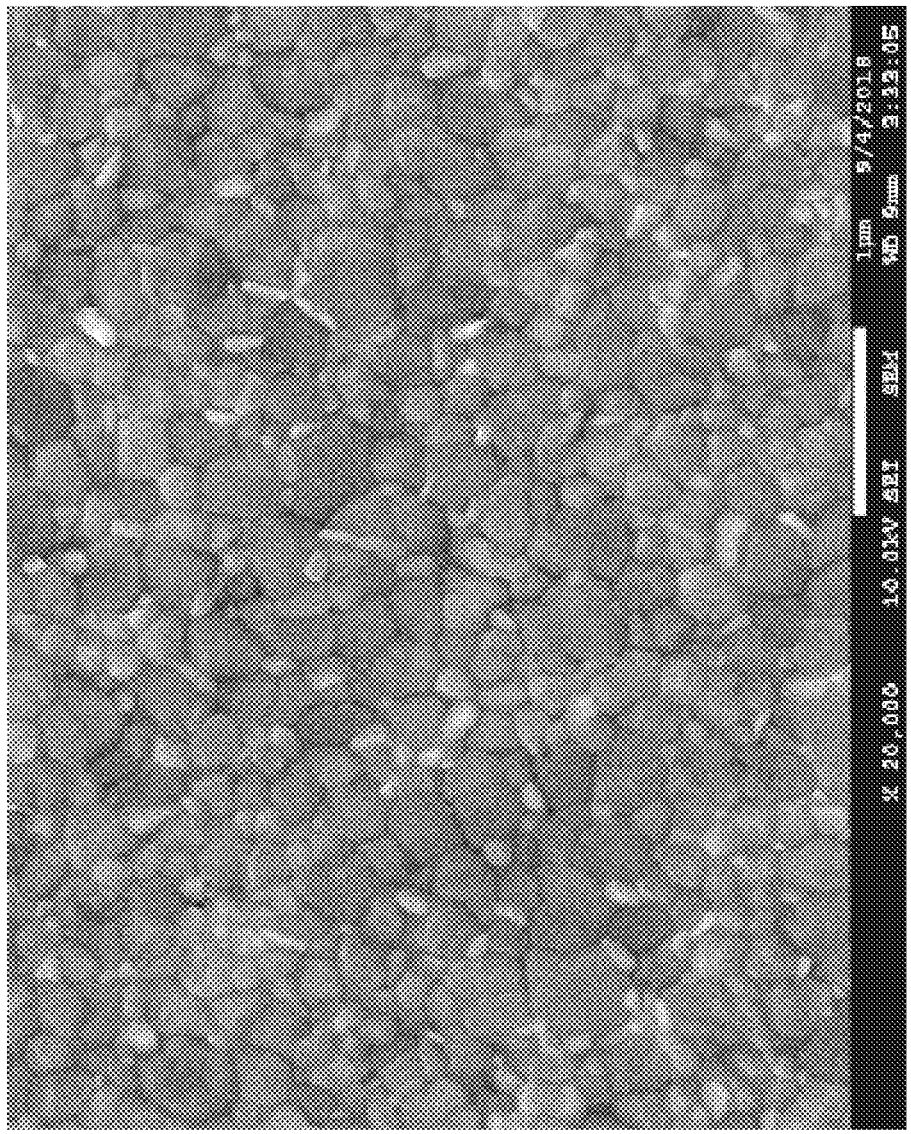
FIG. 10 is a surface view of the perovskite film of comparative example 1-7 of the present disclosure observed by a scanning electron microscope.

The precursor composition was prepared by the same method as described in Example 1-1, except that the precursor composition was coated on the substrate by spin coating to form a perovskite film with a thickness of 0.72 micron, wherein the substrate was coated at room temperature, and the speed of spin-coating rotation was set at 3000 rpm for 10 seconds, and then at 6000 rpm for 30 seconds. Further, 100 μL chlorobenzene was added as an anti-solvent to the perovskite film, while spin coating. At last, the surface of the perovskite film produced was observed and recorded in FIG. 10.

From the result above, it can be seen that the mechanism of film forming by spin coating is rapid nucleation performed first, then crystal growth proceeded. Unlike the embodiment of the present disclosure, the mechanism is nucleation and crystal growth performed simultaneously. Therefore, it can be seen in the surface view of FIG. 10 that the size of the crystal grains formed by Comparative Example 1-7 was relatively small, and the fluctuations of grain boundary were obvious, which made the surface roughness of the film greater.

Example 2-1: Preparation of a Semiconductor Element

The structure of an element can be expressed as: FTO/TiO$_2$ (less than 10 nm)/meso-TiO$_2$ (about 15 to 30 nm)/perovskite film (610 nm) of Example 1-1/Spiro-OMeTAD (250 nm)/Au (125 nm).

Finally, the analysis of the semiconductor element produced was measured by using the solar simulation system (Enlitech, SS-F5-3A) with the light source and the intensity of the light source set to AN 1.5G, the power of light set to 100 mW/cm$^2$; and combining the power supply and Laboratory virtual instrument engineering platform to measure the current-voltage curve, conversion efficiency (PCE), short circuit current (J$_{SC}$), open circuit voltage (V$_{OC}$), fill factor (FF), and series resistance (Rs) of semiconductor element and other component parameters. The results are recorded in Table 1, and FIGS. 11 and 12.

Figure 13:
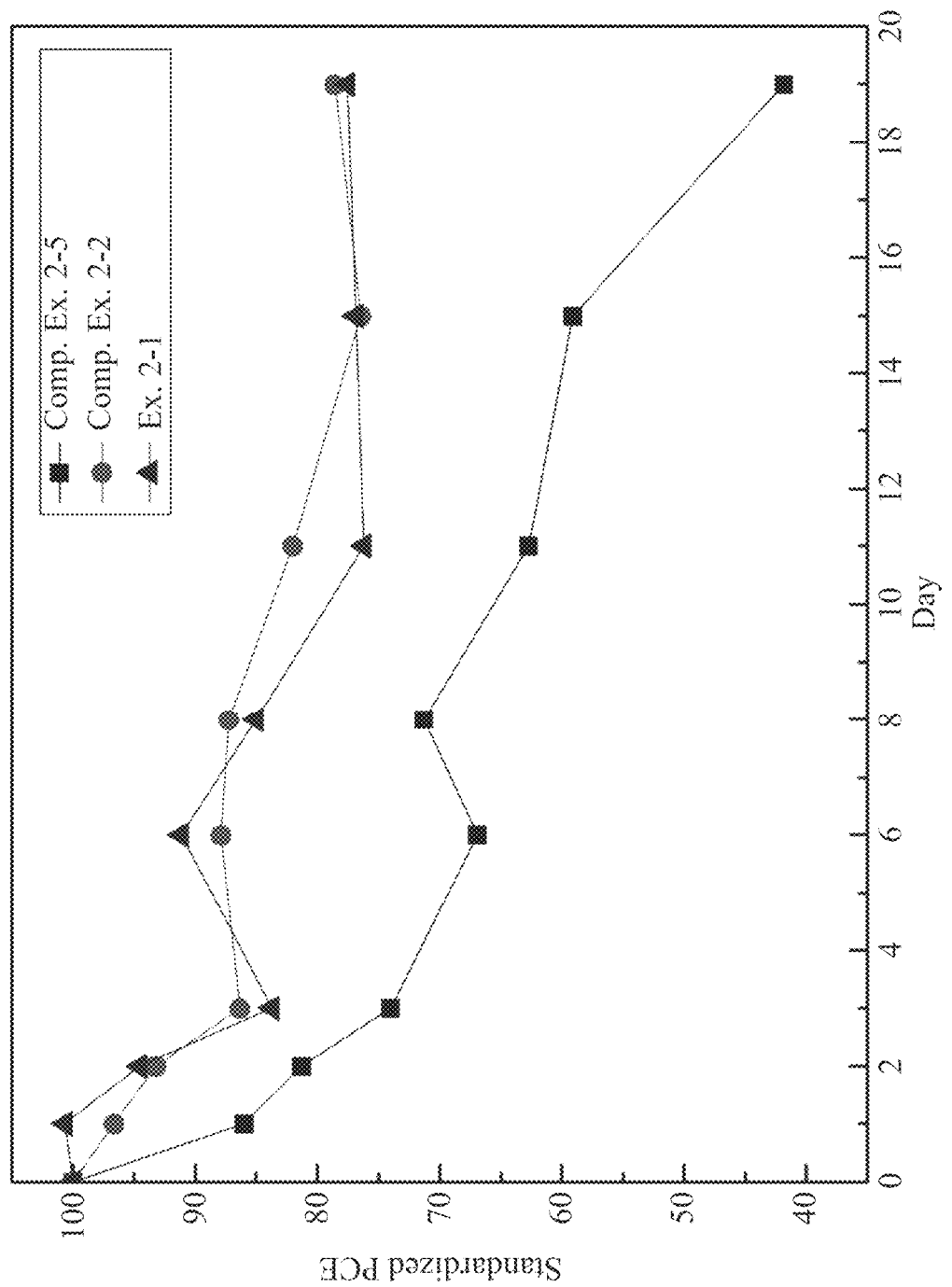
FIG. 13 is a measurement diagram of element stability of the semiconductor element of the examples and the comparative example of the present disclosure.

Then, the stability of the element was observed in a dark environment with a humidity of 40 to 45% and a temperature of 26 to 27° C., and recorded the results in FIG. 13.

Figure 11:
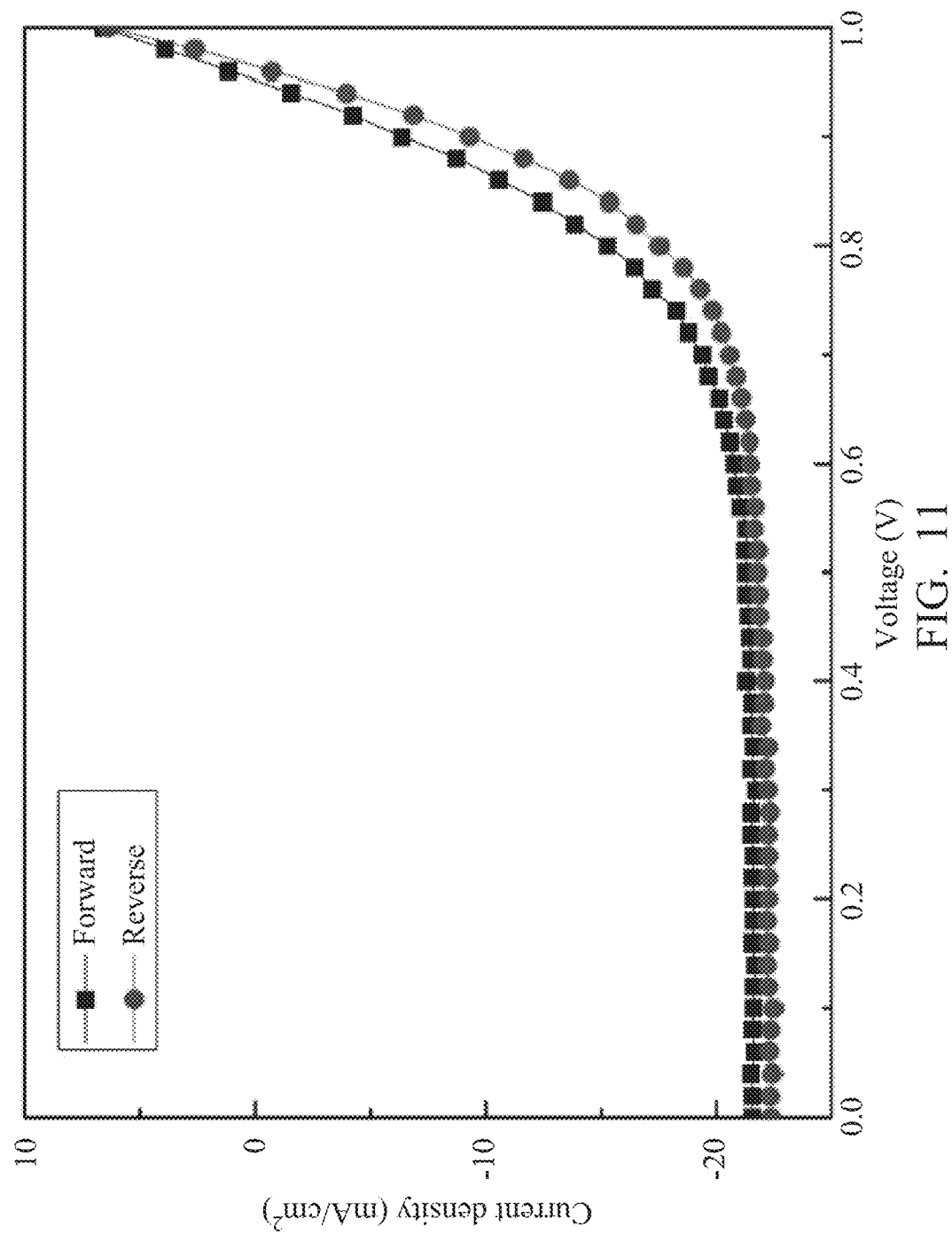
FIG. 11 is a current-voltage characteristic diagram of the semiconductor elements of the examples of the present disclosure.
Figure 12:
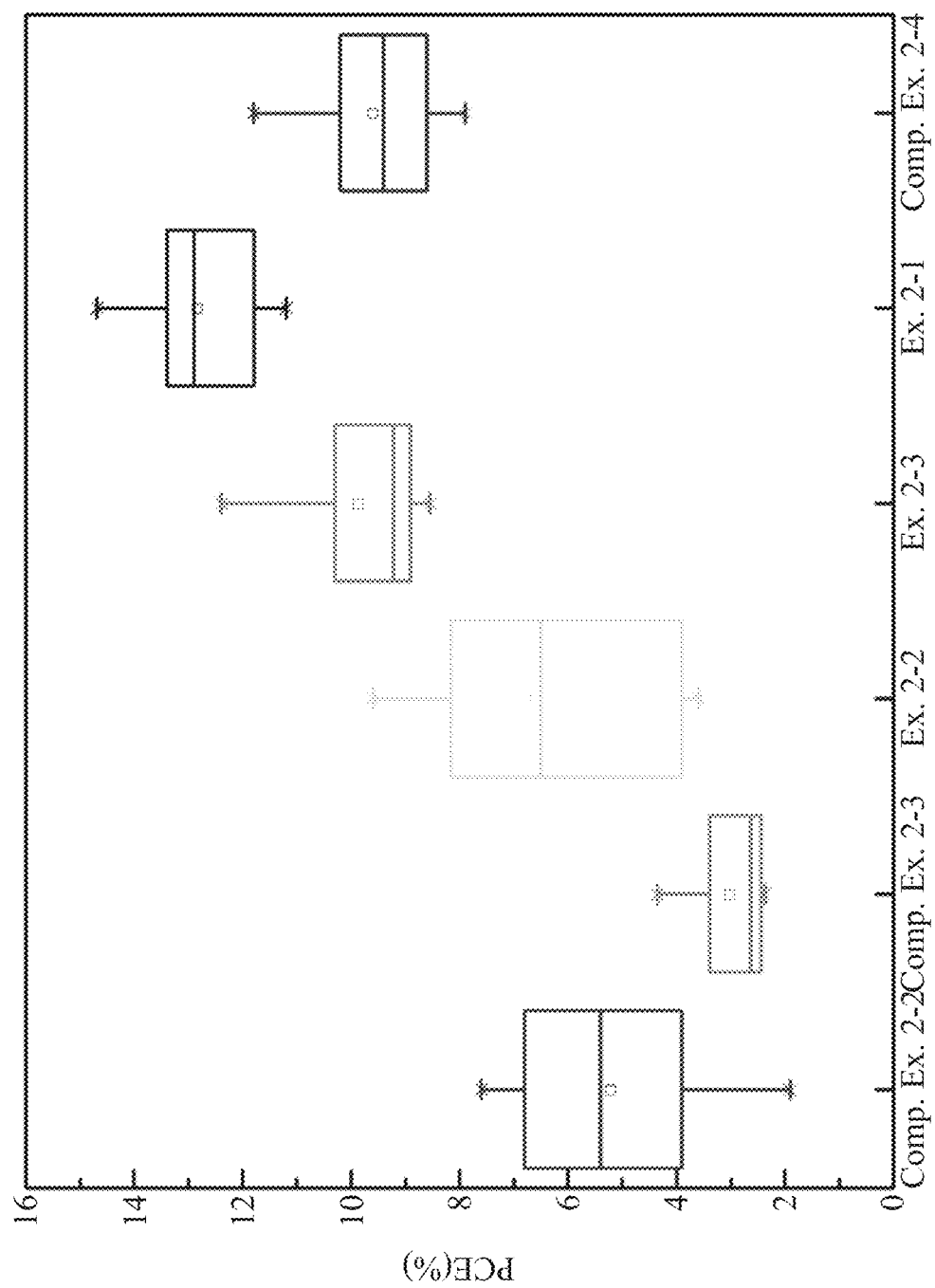
FIG. 12 is a comparison diagram of the PCE parameter values of the semiconductor elements of the examples and the comparative example of the present disclosure.

From the results in FIGS. 11 to 13 and Table 1, it can be seen that the perovskite film had an optimized lattice arrangement and larger grain size of crystal, due to the use of crown ether compounds and dispersants in the semiconductor element manufactured in the present disclosure, which significantly improved the efficiency and stability of the semiconductor element.

TABLE 1

| Example | Direction of voltage | PCE (%) | FF (%) | J$_{sc}$ (mA/cm$^2$) | V$_{oc}$ (V) | R$_s$ (Ω) |
|---|---|---|---|---|---|---|
| Ex. 2-1 | Forward | 11.9 | 53.4 | 22.4 | 0.94 | 159.9 |
|  | Reverse | 14.7 | 67.9 | 22.4 | 0.96 | 131.9 |

Examples 2-2 to 2-3: Preparations of Semiconductor Elements

The semiconductor elements were prepared by the same method as described in Example 2-1, except that the molarities of 18-crown-6 in the precursor composition were 0.25 mM and 0.45 mM, respectively. After completing the preparation, the method of analysis on the semiconductor elements produced were measured according to the method of Example 2-1, and the results of the PCE parameter are recorded in FIG. 12.

Examples 2-4 to 2-7: Preparations of Semiconductor Elements

The semiconductor elements were prepared by the same method as described in Example 2-1, except that the types of dispersants were methanol, ethanol, isopropanol, and butanol. After completing the preparation, The semiconductor element produced was measured according to the method of Example 2-1, and the results of the PCE parameter are recorded in Table 2.

Example 2-8: Preparation of a Semiconductor Element

The semiconductor element was prepared by the same method as described in Example 2-1, except that the perovskite precursor salts in the precursor composition were methylamine hydroiodide (MAI) and lead iodide (PbI$_2$), and the molarities of methylamine hydroiodide (MAI) and lead iodide (PbI$_2$) were respectively 1.2 M and 1.2 M, thereby obtaining a perovskite thin film including crystal grains with a crystalline structure of MAPbI$_3$.n[C], wherein the [C] was 18-crown-6. After completing the preparation, the semiconductor element prepared was measured according to the method of analysis in Example 2-1, and the result of the PCE parameter are recorded in Table 4.

Examples 2-9 to 2-11: Preparations of Semiconductor Elements

The semiconductor elements were prepared by the same method as described in Example 2-8, except that the types of dispersant were methanol, ethanol and isopropanol. After completing the preparation, the semiconductor element prepared was measured according to the method of analysis in Example 2-1, and the result of the PCE parameter are recorded in Table 4.

Example 2-12: Preparation of a Semiconductor Element

The semiconductor element was prepared by the same method as described in Example 2-1, except that the perovskite precursor salts in the precursor composition were 2-phenylethylamine hydroiodide (PEAI), methylamine hydroiodide (MAI) and lead iodide (PbI$_2$), and the molarities of 2-phenylethylamine hydroiodide (PEAI), methylamine hydroiodide (MAI) and lead iodide (PbI$_2$) were respectively 0.025 M, 1 M, and 0.9875 M, thereby obtaining a perovskite thin film including crystal grains with a crystalline structure of (PEA)$_2$MA$_{79}$Pb$_{80}$I$_{124}$.n[C], wherein the [C] was 18-crown-6.

After completing the preparation, the semiconductor element prepared was measured according to the method of analysis in Example 2-1, and the result of the PCE parameter are recorded in Table 5.

Examples 2-13 to 2-14: Preparations of Semiconductor Elements

The semiconductor element was prepared by the same method as described in Example 2-12, except that the types of dispersants are methanol and ethanol. After completing the preparation, the semiconductor element produced was measured according to the method of Example 2-1, and results of the PCE parameter are recorded in Table 5.

Comparative Example 2-1

The semiconductor element was prepared by the same method as described in Example 2-1, but without the dispersant, 1-propanol. After completing the preparation, the semiconductor element prepared was measured according to the method of analysis in Example 2-1, and the result of the PCE parameter are recorded in Table 2.

TABLE 2

| Example | Type of dispersant | PCE (%) |
| --- | --- | --- |
| Comp. Ex. 2-1 | None | 7.9 |
| Ex. 2-1 | 1-propanol | 14.7 |
| Ex. 2-4 | Methanol | 8.5 |
| Ex. 2-5 | Ethanol | 11.6 |
| Ex. 2-6 | Isopropanol | 8.9 |
| Ex. 2-7 | Butanol | 9.3 |

Comparative Example 2-2

The semiconductor element was prepared by the same method as described in Example 2-1, but without 18-crown-6. After completing the preparation, the semiconductor element prepared was measured according to the method of analysis in Example 2-1, and the results of PCE parameter and the stability of the elements are recorded in FIGS. 12 and 13.

Comparative Example 2-3 to 2-4

The semiconductor elements were prepared by the same method as described in Example 2-1, except that the molarities of 18-crown-6 in the precursor composition were 0.05 mM and 1.9 mM, respectively. The semiconductor elements prepared were measured according to the method of analysis in Example 2-1, and the results of PCE parameter are recorded in FIG. 12.

Comparative Example 2-5

Figure 14:
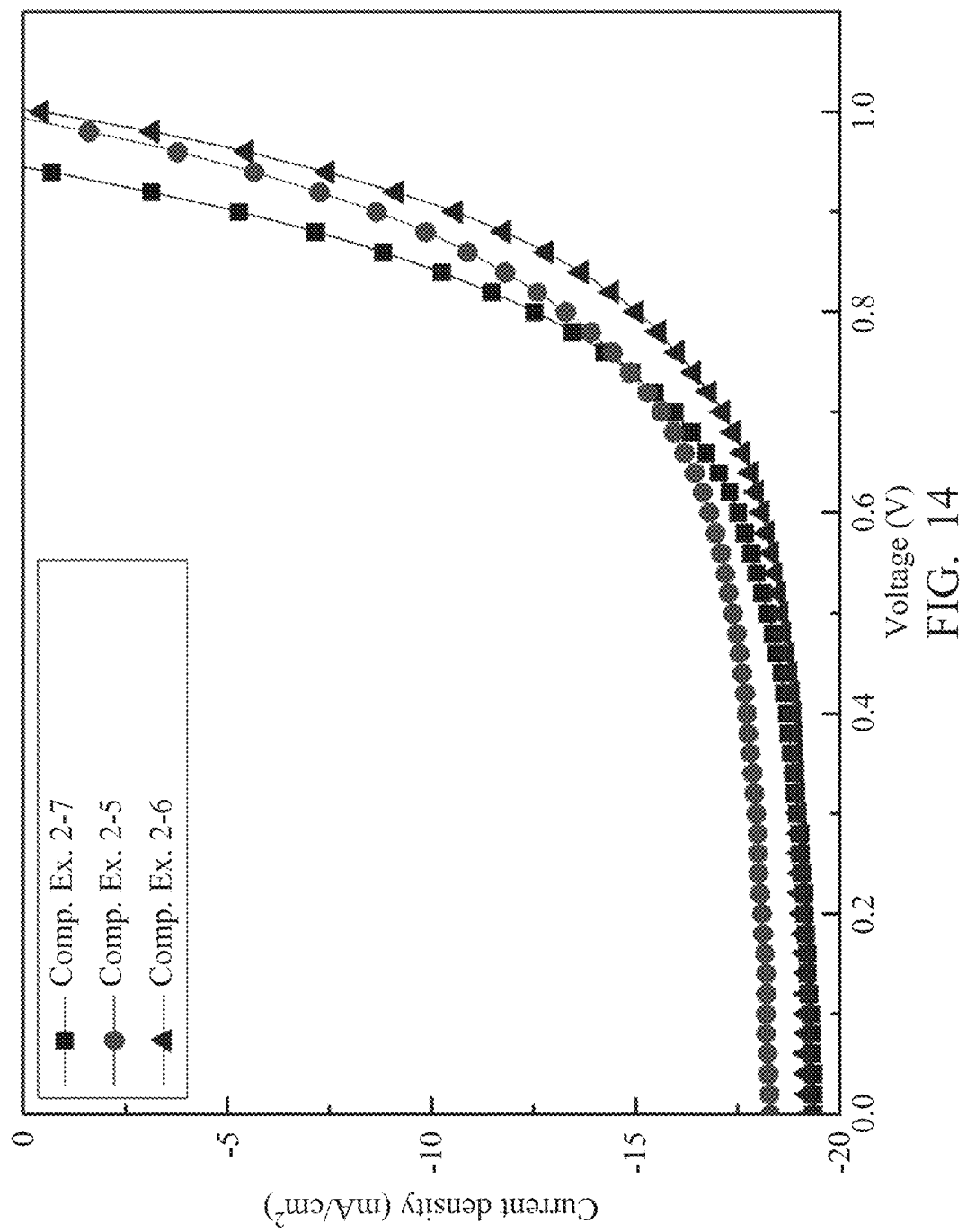
FIG. 14 is a current-voltage characteristic diagram of the semiconductor elements of the comparative examples of the present disclosure.

The semiconductor element was prepared by the same method as described in Example 2-1, but without 18-crown-6 and the dispersant, 1-propanol. After completing the preparation, the semiconductor element produced was measured according to the method of Example 2-1, and the results of the element parameters and stability are recorded in Table 3 and FIGS. 13 and 14.

Comparative Example 2-6

The semiconductor element was prepared by the same method as described in Comparative Example 2-2, except that the dispersant was isopropanol. After completing the preparation, the semiconductor elements prepared were measured according to the method of analysis in Example 2-1, and the results of PCE parameter are recorded in Table 3 and FIG. 14.

Comparative Example 2-7

The semiconductor element was prepared by the same method as described in Comparative Example 2-5, except that the mixed solvent in the precursor composition was changed to dimethylformamide (DMF). After completing the preparation, the semiconductor elements prepared were measured according to the method of analysis in Example 2-1, and the results of element parameter are recorded in Table 3 and FIG. 14.

TABLE 3

| Example | PCE (%) | FF (%) | Jsc (mA/cm$^2$) | Voc (V) | Rs (Ω) |
| --- | --- | --- | --- | --- | --- |
| Comp. Ex. 2-5 | 11.0 | 60.5 | 18.3 | 0.99 | 70.5 |
| Comp. Ex. 2-6 | 12.3 | 64.1 | 19.3 | 1.01 | 56.8 |
| Comp. Ex. 2-7 | 11.7 | 61.1 | 19.4 | 0.95 | 61.8 |

Comparative Example 2-8

The semiconductor element was prepared by the same method as described in Example 2-8, but without dispersant 1-propanol. After completing the preparation, the semiconductor elements prepared were measured according to the method of analysis in Example 2-1, and the results of element parameter are recorded in Table 4. From the result above, it can be seen that the precursor composition containing the dispersant actually has the effect of improving the element efficiency of the semiconductor element.

TABLE 4

| Example | Type of dispersant | PCE (%) |
| --- | --- | --- |
| Comp. Ex. 2-8 | None | 10.1 |
| Ex. 2-8 | 1-propanol | 12.5 |
| Ex. 2-9 | Methanol | 10.5 |
| Ex. 2-10 | Ethanol | 10.9 |
| Ex. 2-11 | Isopropanol | 10.3 |

Comparative Example 2-9

The semiconductor element was prepared by the same method as described in Example 2-12, but without the dispersant, 1-propanol. After completing the preparation, the semiconductor elements prepared were measured according to the method of analysis in Example 2-1, and the results of element parameter are recorded in Table 5. From the result above, it can be seen that the precursor composition containing the dispersant actually has the effect of improving the element efficiency of the semiconductor element.

TABLE 5

| Example | Type of dispersant | PCE (%) |
| --- | --- | --- |
| Comp. Ex. 2-9 | None | 11.2 |
| Ex. 2-12 | 1-propanol | 14.1 |
| Ex. 2-13 | Methanol | 11.9 |
| Ex. 2-14 | Ethanol | 12.1 |

In conclusion, the present disclosure uses crown ether compounds and dispersants in the precursor composition to reduce the agglomeration phenomenon in the precursor composition, which helps to make the nucleation point disperse and nucleate uniformly during the film formation process of the perovskite film, and assists the crystal grain growth rate thereof to be identical at the same time, so as to form crystal grains with [A][B][X]$_3$.n[C] crystalline structure to maximize the crystal grain size, In turn, a highly uniform film is obtained.

The prepared perovskite film has an optimized lattice arrangement and a larger grain size, which can reduce impurities, lower the surface roughness of formed film, and improve the effect of the photocurrent generation behavior of the element, even in large-area film formation. The semiconductor element can also achieve high efficiency and stability, and indeed has prospect of applications.

The above Examples are used for illustration only but not for limiting the present disclosure. Modifications and alterations can be made to above Examples by anyone skilled in the art without departing from the spirit and scope of the present disclosure. Therefore, the range claimed by the present disclosure should be defined by appended claims and should be encompassed within the disclosure of the present disclosure as long as that doesn't influence effects and purposes of the present disclosure.

What is claimed is:

1. A precursor composition for preparing a perovskite film, comprising:
    a mixed solvent containing a dispersant and a polar solvent, wherein the dispersant is at least one selected from the group consisting of $C_{1-5}$ alkyl alcohol, $C_{2-6}$ alkoxy alcohol, and $C_{5-8}$ alkoxyalkyl ester, and the polar solvent is at least one selected from the group consisting of γ-butyrolactone, dimethyl sulfoxide, dimethylformamide, dimethylacetamide, 1,3-dimethyl propylene urea and N-methylpyrrolidone; and
    a perovskite precursor salt and a molarity of 0.55 to 1.6 mM of crown ether compound dispersed or dissolved in the mixed solvent,
    wherein the volume percentage of the dispersant in the precursor composition is 5 to 9.5%;
    wherein the perovskite precursor salt comprises a compound of the chemical formula AX and a compound of the chemical formula $BX_2$;
    wherein A is one monovalent cation selected from $M_1$, $M_2$ and $M_3$;
    wherein $M_1$ is a substituted or unsubstituted ammonium ion, $M_2$ is a substituted or unsubstituted amidine ion, $M_3$ is an alkali-metal ion selected from the group consisting of $Cs^+$, $Rb^+$, $Li^+$ and $Na^+$, and each of the substituents of the $M_1$ and the $M_2$ is $C_{1-20}$ alkyl or $C_{6-20}$ aryl when the $M_1$ and the $M_2$ are substituted;
    wherein B is one divalent cation selected from the group consisting of $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pb^{2+}$, $Ge^{2+}$, $Sn^{2+}$, $Yb^{2+}$ and $Eu^{2+}$;
    wherein X of AX is one monovalent anions selected from the group consisting of $F^-$, $Cl^-$, $Br^-$, $I^{31}$, $SCN^-$, and $OCN^-$, and X of $BX_2$ is one monovalent anion selected from the group consisting of $F^-$, $Cl^-$, $Br^-$, $I^-$, $SCN^-$, and $OCN^-$; and
    wherein the crown ether compound is at least one selected from the group consisting of 12-crown-4, 15-crown-5, 18-crown-6, 21-crown-7, 24-crown-8, and 30-crown-10.

2. The precursor composition of claim 1, further comprising a colloidal particle with a size of less than 500 nm, and the colloidal particles comprise the compound and the crown ether compound.

3. The precursor composition of claim 1, wherein the polar solvent comprises γ-butyrolactone and dimethyl sulfoxide, and the volume ratio of the γ-butyrolactone to the dimethyl sulfoxide is 10:1 to 1:10.

* * * * *